(12) United States Patent
Kim et al.

(10) Patent No.: US 12,038,787 B2
(45) Date of Patent: *Jul. 16, 2024

(54) ELECTRONIC DEVICE INCLUDING WATERPROOF STRUCTURE

(71) Applicant: Samsung Electronics Co., Ltd., Gyeonggi-do (KR)

(72) Inventors: Seonghoon Kim, Gyeonggi-do (KR); Hyunho Shin, Gyeonggi-do (KR); Sunggun Cho, Gyeonggi-do (KR); Kyungtae Kim, Gyeonggi-do (KR); Kwangtai Kim, Gyeonggi-do (KR); Donghyun Yeom, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 360 days.

This patent is subject to a terminal disclaimer.

(21) Appl. No.: 17/504,701

(22) Filed: Oct. 19, 2021

(65) Prior Publication Data

US 2022/0137667 A1 May 5, 2022

Related U.S. Application Data

(63) Continuation of application No. PCT/KR2021/013990, filed on Oct. 12, 2021.

(30) Foreign Application Priority Data

Nov. 5, 2020 (KR) .................. 10-2020-0146745

(51) Int. Cl.
*G06F 1/16* (2006.01)
*H05K 5/02* (2006.01)

(52) U.S. Cl.
CPC .......... *G06F 1/1652* (2013.01); *G06F 1/1656* (2013.01); *G06F 1/1681* (2013.01); *H05K 5/0226* (2013.01)

(58) Field of Classification Search
CPC .... G06F 1/1652; G06F 1/1656; G06F 1/1681; G06F 1/16; G06F 1/1616; H05K 5/0226
See application file for complete search history.

(56) References Cited

U.S. PATENT DOCUMENTS 9,326,375 B2 4/2016 Lee
2005/0141186 A1 6/2005 Shimizu
(Continued)

FOREIGN PATENT DOCUMENTS

CN 210835795 U 6/2020
EP 3 509 280 A1 7/2019
(Continued)

OTHER PUBLICATIONS

European Search Report dated Dec. 20, 2023.
International Search Report dated Jan. 7, 2022.
Written Opinion dated Jan. 7, 2022.

*Primary Examiner* — Sagar Shrestha
(74) *Attorney, Agent, or Firm* — Cha & Reiter, LLC

(57) ABSTRACT

An electronic device is disclosed, including a first housing with a first support member, a second housing foldably coupled to the first housing through a hinge mechanism and including a second support member, a flexible display supported by the first housing and the second housing, the flexible display including: a window layer, a display panel disposed under the window layer, and a bending portion extended from the display panel and attached to a rear surface of the display panel, the bending portion including: an extension portion and a control circuit and a flexible substrate, a first waterproof member, a second waterproof member, and a third waterproof member that connects the first waterproof member and second waterproof member, wherein when the flexible display is viewed from above, the (Continued)

control circuit and the flexible substrate overlap a first waterproof space formed through the first, second and third waterproof member.

20 Claims, 16 Drawing Sheets

(56) References Cited

U.S. PATENT DOCUMENTS

| | | | |
|---|---|---|---|
| 2016/0293870 A1 | 10/2016 | Nakagawa | |
| 2018/0033571 A1* | 2/2018 | Choi | G06F 1/1671 |
| 2019/0006615 A1* | 1/2019 | Jung | H10K 50/8426 |
| 2019/0072997 A1* | 3/2019 | Cha | G06F 1/1626 |
| 2019/0239374 A1 | 8/2019 | Cha | |
| 2019/0254129 A1* | 8/2019 | Cho | H05B 33/04 |
| 2019/0343013 A1 | 11/2019 | Choi et al. | |
| 2020/0162596 A1* | 5/2020 | Kim | H05K 1/028 |
| 2020/0319672 A1 | 10/2020 | Kim et al. | |
| 2020/0348725 A1* | 11/2020 | Kim | H05K 5/0217 |
| 2021/0204435 A1 | 7/2021 | Choi et al. | |
| 2022/0386491 A1* | 12/2022 | Cho | H05K 5/03 |
| 2023/0051260 A1* | 2/2023 | An | G06F 1/1656 |

FOREIGN PATENT DOCUMENTS

| | | |
|---|---|---|
| JP | 2005-189499 A | 7/2005 |
| JP | 2012-28842 A | 2/2012 |
| KR | 10-2012-0061172 A | 6/2012 |
| KR | 10-2014-0016052 A | 2/2014 |
| KR | 10-2014-0032648 A | 3/2014 |
| KR | 10-2018-0026191 A | 3/2018 |
| KR | 10-2019-0054384 A | 5/2019 |
| KR | 10-2037694 B1 | 10/2019 |
| KR | 10-2020-0057236 A | 5/2020 |

* cited by examiner

ELECTRONIC DEVICE INCLUDING WATERPROOF STRUCTURE

CROSS-REFERENCE TO RELATED APPLICATION

This application is a continuation of International Application No. PCT/KR2021/013990, filed on Oct. 12, 2021 which is based on and claims priority under 35 U.S.C. § 119 to Korean Patent Application No. 10-2020-0146745, filed on Nov. 5, 2020, in the Korean Intellectual Property Office, the disclosure of which is incorporated by reference herein in its entirety.

TECHNICAL FIELD

Certain embodiments of the disclosure relate to an electronic device including a waterproof structure.

BACKGROUND ART

Recent portable electronic devices have seen design trends towards slimness and increased rigidity, which serves to enhance design aesthetics and differentiate functional elements therein. The previous near-uniform usage of a rectangular shape for these devices is now evolving into more diverse and sometimes modifiable shapes. Electronic devices having modifiable shapes, like foldable housings, may support increased portability and larger display areas. Further improvements include waterproofing and dustproofing, which prevents internal components from being damaged by water and foreign elements. A foldable electronic device may include a hinge mechanism (e.g., hinge module), and first and second housings which may be foldably coupled through the hinge mechanism. This foldable electronic device may be operated in an in-folding and/or out-folding manner, where the first housing is rotated within a range of 0 to 360 degrees with respect to the second housing via the hinge mechanism. The foldable electronic device may include a flexible display that is disposed to traverse both the first housing and the second housing when the electronic device is disposed a 180 degree-unfolded state.

The flexible display may include a bendable display panel. The display panel may include a bending portion that is extended to one side and arranged in a folding manner on the rear surface of the flexible display. For example, when the flexible display is disposed in the foldable electronic device and the display panel is viewed from above, the bending portion may be disposed to extend outwardly from the periphery of the display panel, and then fold towards the rear surface of the flexible display. The bending portion may include an extension portion that extends from the display panel, and include a control circuit and a flexible substrate (e.g., flexible printed circuit board or "FPCB") that is connected to the extension portion and the substrate of the foldable electronic device, and includes a plurality of electrical elements.

Meanwhile, the folding and unfolding operation mechanism may render other devices vulnerable to water. Accordingly, to increase waterproofing and/or dustproofing against moisture and/or foreign substances, the electronic device may have separate waterproof structures for different individual components.

However, as the foldable electronic device does not provide a separate waterproof structure for the bending portion, the control circuit disposed on the extension portion and/or a plurality of electrical elements disposed on the flexible substrate may be poorly or inadequately waterproofed.

Various embodiments of the disclosure may provide an electronic device including a waterproof structure capable of blocking moisture and/or foreign substances introduced from the outside.

SUMMARY

According to certain embodiments, an electronic device may include: a first housing including a first support member; a second housing foldably coupled to the first housing through a hinge mechanism and including a second support member; a flexible display supported by the first housing and the second housing, the flexible display including: a window layer, a display panel disposed under the window layer, and a bending portion extended from the display panel and attached to a rear surface of the display panel, the bending portion including: an extension portion extending outside the display panel and including a control circuit, and a flexible substrate electrically connected to the extension portion; a first waterproof member disposed between the display panel and the first support member to substantially surround the bending portion; a second waterproof member disposed between the bending portion and the first support member; and a third waterproof member that connects one end of the first waterproof member and one end of the second waterproof member, and connecting another end of the first waterproof member and another end of the second waterproof member, wherein when the flexible display is viewed from above, the control circuit and the flexible substrate overlap a first waterproof space formed through the first waterproof member, the second waterproof member, and the third waterproof member.

According to certain embodiments, an electronic device may include: at least one housing, a display supported by the at least one housing, the display including: a window layer, a display panel disposed under the window layer, and a bending portion extending from the display panel and attached to a rear surface of the display panel, the bending portion including: an extension portion extending outside the display panel and including a control circuit, and a flexible substrate electrically connected to the extension portion, a first waterproof member disposed between the display panel and the housing to substantially surround the bending portion, a second waterproof member disposed between the bending portion and the housing, and a third waterproof member that connects one end of the first waterproof member and one end of the second waterproof member, and connecting the other end of the first waterproof member and the other end of the second waterproof member, wherein when the display is viewed from above, the control circuit and the flexible substrate are arranged at positions overlapping a waterproof space formed through the first waterproof member, the second waterproof member, and the third waterproof member.

According to example embodiments of the disclosure, a waterproof structure is separately provided for the bending portion that is folded toward the rear surface of the display panel, which may block moisture and/or foreign substances introduced from the outside and help the display to operate smoothly.

In addition, various effects directly or indirectly identified through this document may be provided.

SUMMARY OF DRAWINGS

In connection with the description of the drawings, the same or similar reference symbols may be used for the same or similar components.

DETAILED DESCRIPTION

Figure 1A:
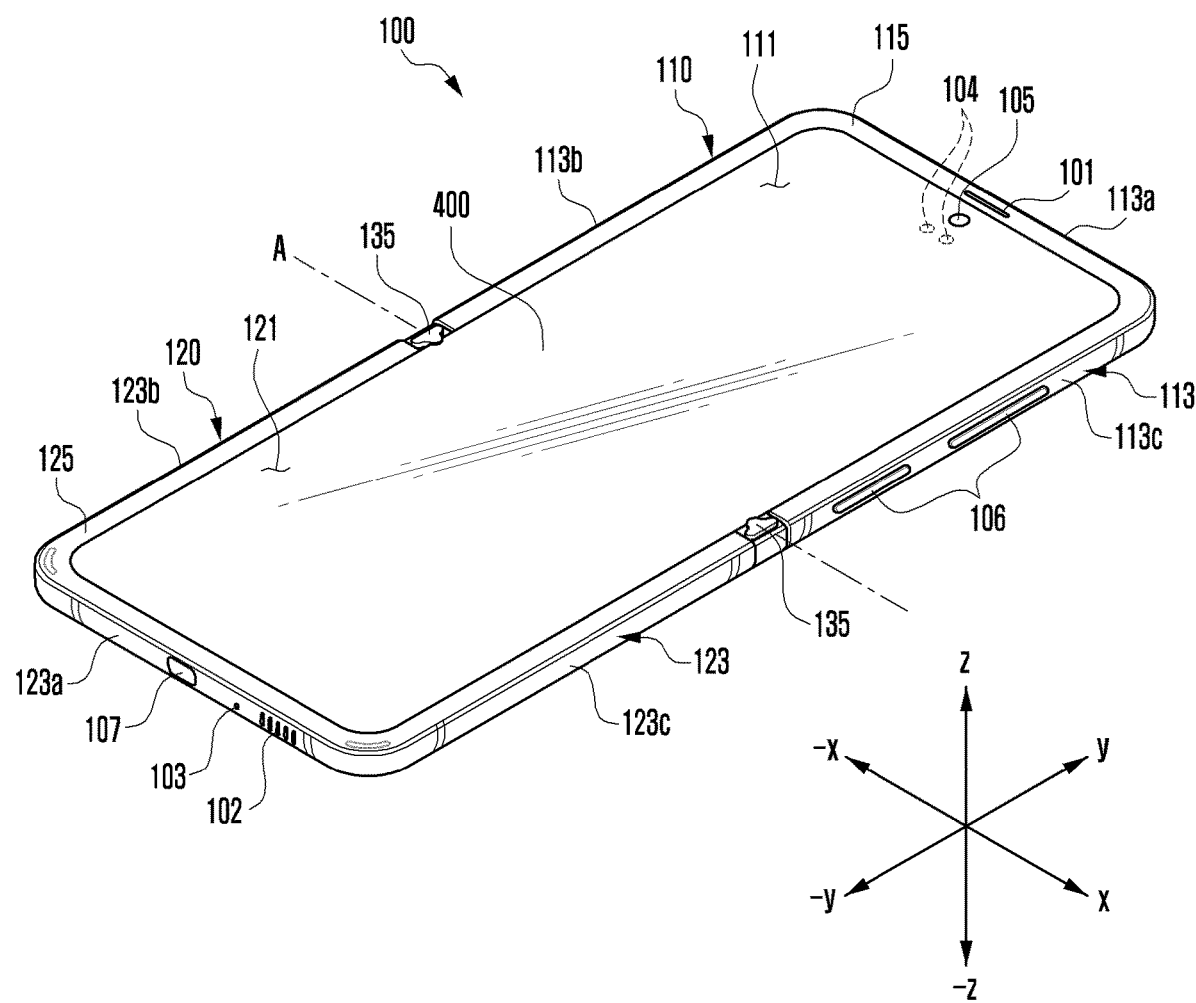
FIG. 1A is a front perspective view of an electronic device in a flat or unfolded state according to certain embodiments of the disclosure.
Figure 1B:
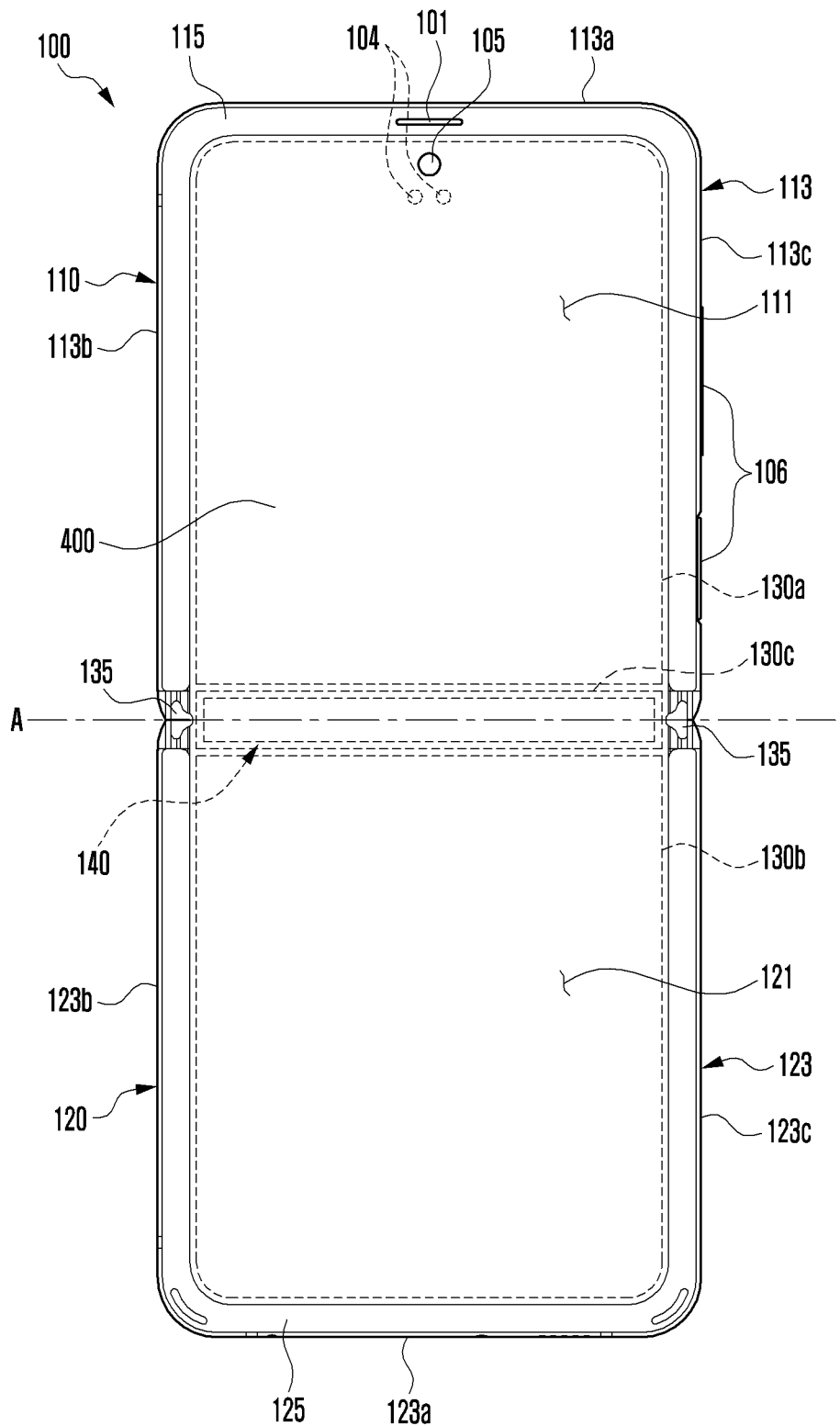
FIG. 1B is a plan view illustrating the front of the electronic device in an unfolded state according to certain embodiments of the disclosure.
Figure 1C:
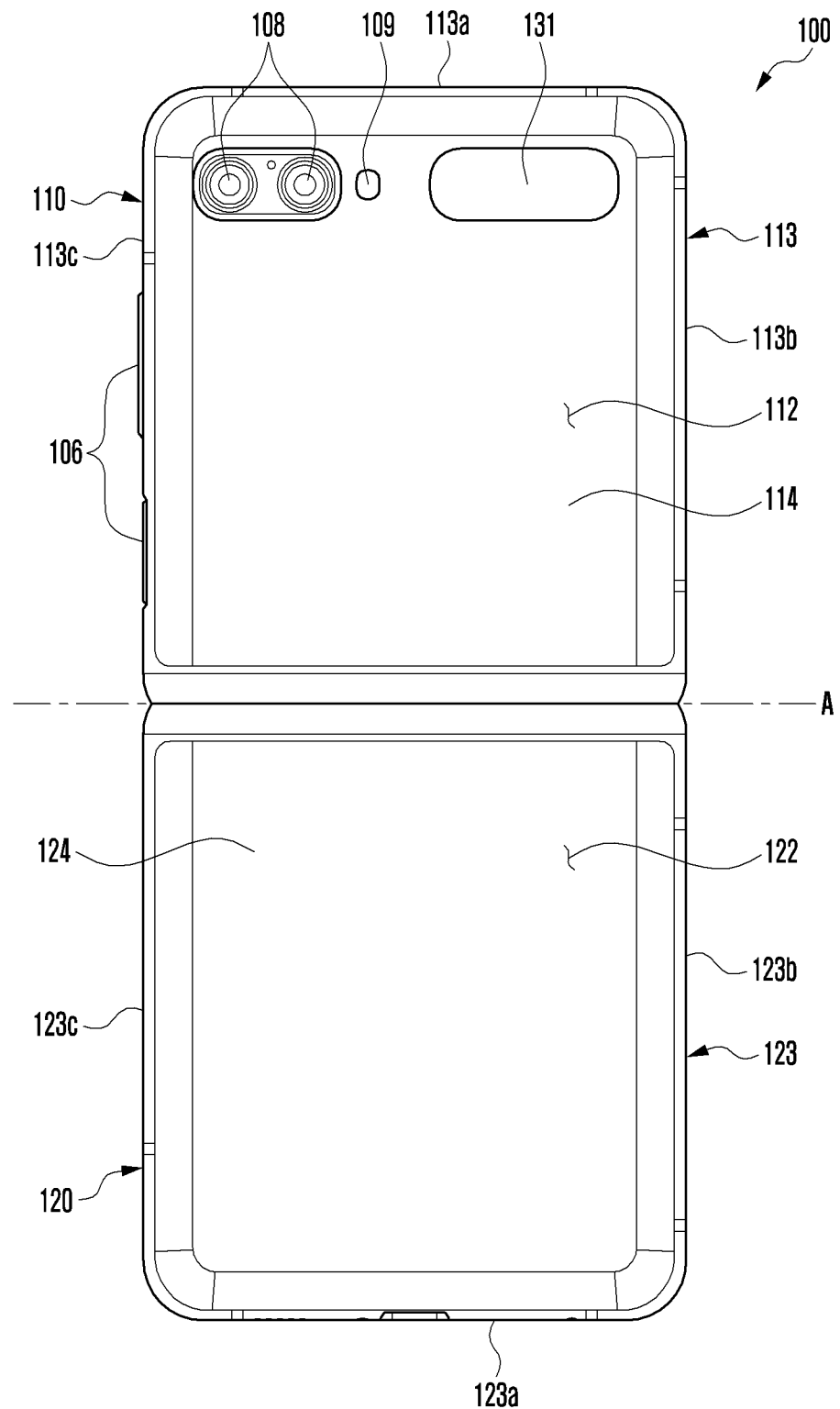
FIG. 1C is a plan view illustrating the back of the electronic device in an unfolded state according to certain embodiments of the disclosure.

FIG. 1A is a front perspective view of an electronic device in a flat or unfolded state according to certain embodiments of the disclosure. FIG. 1B is a plan view illustrating the front of the electronic device in an unfolded state according to certain embodiments of the disclosure. FIG. 1C is a plan view illustrating the back of the electronic device in an unfolded state according to certain embodiments of the disclosure.

Figure 2A:
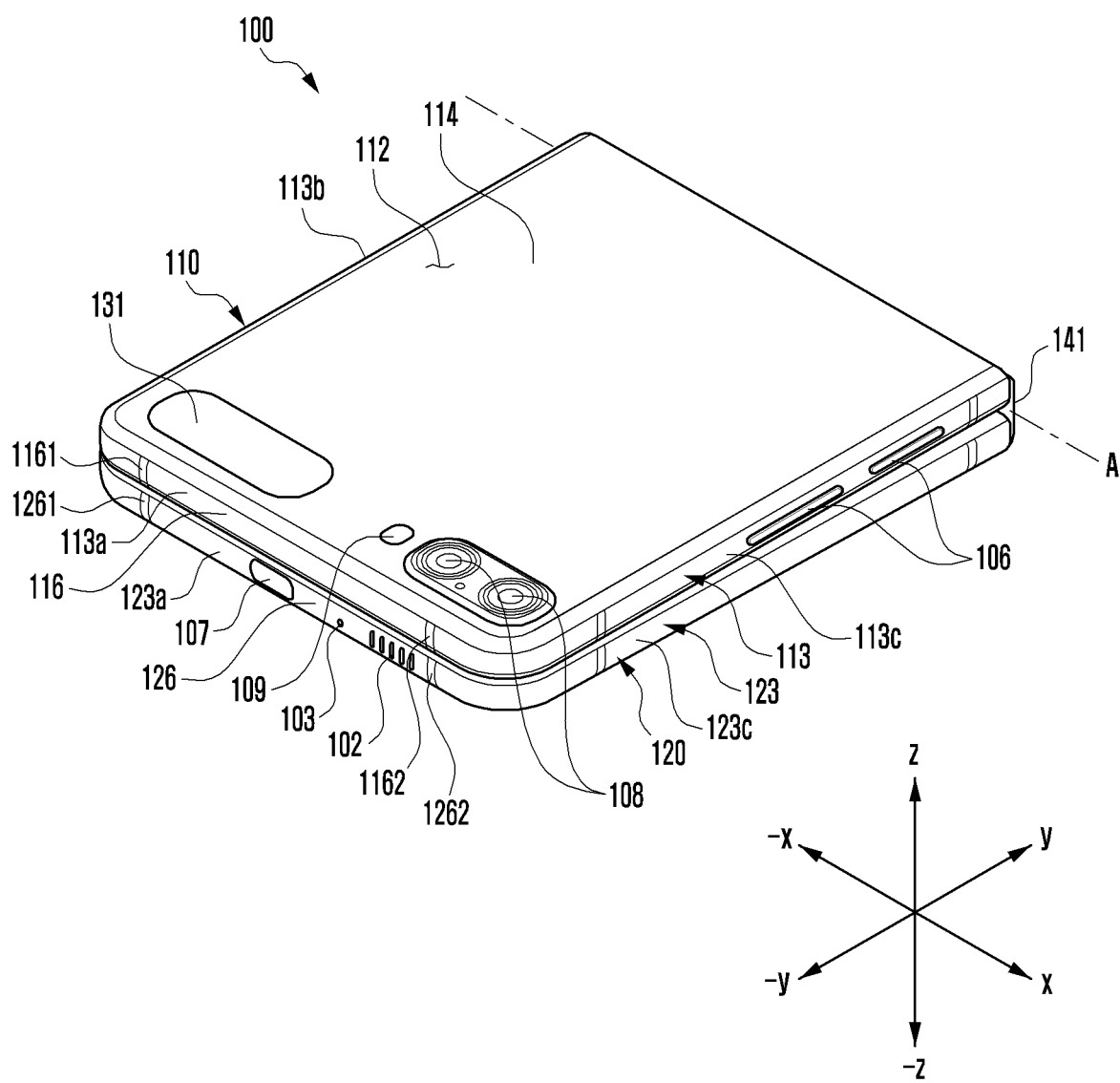
FIG. 2A is a perspective view of the electronic device in a folded state according to certain embodiments of the disclosure.
Figure 2B:
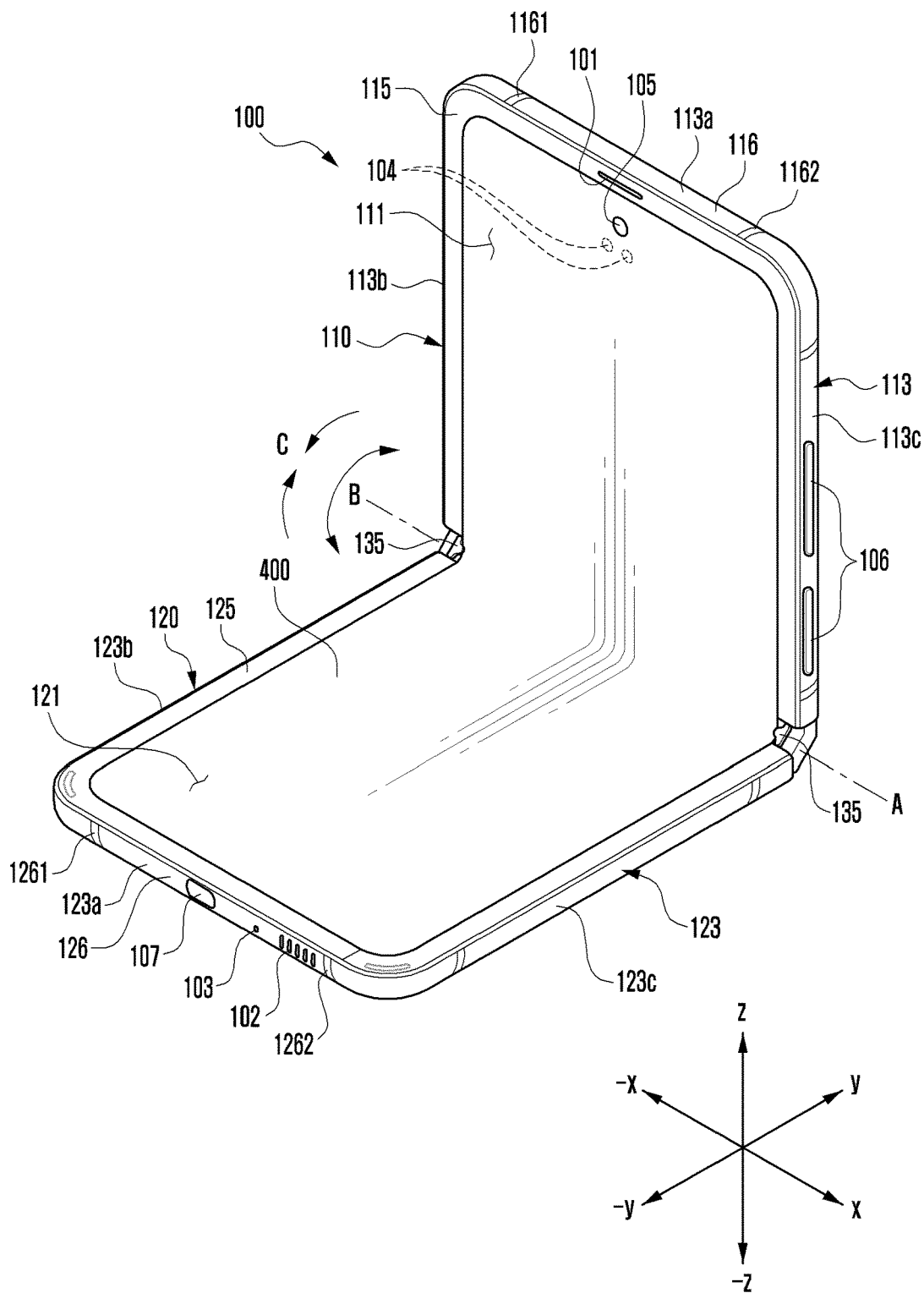
FIG. 2B is a perspective view of the electronic device in an intermediate state according to certain embodiments of the disclosure.

FIG. 2A is a perspective view of the electronic device in a folded state according to certain embodiments of the disclosure. FIG. 2B is a perspective view of the electronic device in an intermediate state according to certain embodiments of the disclosure.

With reference to FIGS. 1A to 2B, the electronic device 100 may include a pair of housings 110 and 120 (e.g., foldable housings) that are rotatably coupled as to allow folding relative to a hinge mechanism (e.g., hinge mechanism 140 in FIG. 1B). In certain embodiments, the hinge mechanism (e.g., hinge mechanism 140 in FIG. 1B) may be disposed in the X-axis direction or in the Y-axis direction. In certain embodiments, two or more hinge mechanisms (e.g., hinge mechanism 140 in FIG. 1B) may be arranged to be folded in a same direction or in different directions. According to an embodiment, the electronic device 100 may include a flexible display 400 (e.g., foldable display) disposed in an area formed by the pair of housings 110 and 120. According to an embodiment, the first housing 110 and the second housing 120 may be disposed on both sides about the folding axis (axis A), and may have a substantially symmetrical shape with respect to the folding axis (axis A). According to an embodiment, the angle or distance between the first housing 110 and the second housing 120 may vary, depending on whether the state of the electronic device 100 is a flat or unfolded state, a folded state, or an intermediate state.

According to certain embodiments, the pair of housings 110 and 120 may include a first housing 110 (e.g., first housing structure) coupled to the hinge mechanism (e.g., hinge mechanism 140 in FIG. 1B), and a second housing 120 (e.g., second housing structure) coupled to the hinge mechanism (e.g., hinge mechanism 140 in FIG. 1B). According to an embodiment, in the unfolded state, the first housing 110 may include a first surface 111 facing a first direction (e.g., front direction) (z-axis direction), and a second surface 112 facing a second direction (e.g., rear direction) (negative z-axis direction) opposite to the first surface 111. According to an embodiment, in the unfolded state, the second housing 120 may include a third surface 121 facing the first direction (z-axis direction), and a fourth surface 122 facing the second direction (negative z-axis direction). According to an embodiment, the electronic device 100 may be operated in such a manner that the first surface 111 of the first housing 110 and the third surface 121 of the second housing 120 face substantially the same first direction (z-axis direction) in the unfolded state, and the first surface 111 and the third surface 121 face one another in the folded state. According to an embodiment, the electronic device 100 may be operated in such a manner that the second surface 112 of the first housing 110 and the fourth surface 122 of the second housing 120 face substantially the same second direction (negative z-axis direction) in the unfolded state, and the second surface 112 and the fourth surface 122 face one another in opposite directions in the folded state. For example, in the folded state, the second surface 112 may face the first direction (z-axis direction), and the fourth surface 122 may face the second direction (negative z-axis direction).

According to certain embodiments, the first housing 110 may include a first side member 113 that at least partially forms an external appearance of the electronic device 100, and a first rear cover 114 coupled to the first side member 113 that forms at least a portion of the second surface 112 of the electronic device 100. According to an embodiment, the first side member 113 may include a first side surface 113a, a second side surface 113b extending from one end of the first side surface 113a, and a third side surface 113c extending from the other end of the first side surface 113a. According to an embodiment, the first side member 113 may be formed in a rectangular shape (e.g., square or rectangle) through the first side surface 113a, second side surface 113b, and third side surface 113c.

According to certain embodiments, the second housing 120 may include a second side member 123 that at least partially forms the external appearance of the electronic device 100, and a second rear cover 124 coupled to the second side member 123, forming at least a portion of the fourth surface 122 of the electronic device 100. According to an embodiment, the second side member 123 may include a fourth side surface 123a, a fifth side surface 123b extending from one end of the fourth side surface 123a, and a sixth side surface 123c extending from the other end of the fourth side surface 123a. According to an embodiment, the second side member 123 may be formed in a rectangular shape through the fourth side surface 123a, fifth side surface 123b, and sixth side surface 123c.

According to certain embodiments, the pair of housings 110 and 120 are not limited to the shape and combinations illustrated herein, and may be implemented with a combination of other shapes or parts. For example, in certain embodiments, the first side member 113 may be integrally formed with the first rear cover 114, and the second side member 123 may be integrally formed with the second rear cover 124.

According to certain embodiments, in the unfolded state of the electronic device 100, the second side surface 113b of the first side member 113 and the fifth side surface 123b of the second side member 123 may be connected without a gap formed therebetween. According to an embodiment, in the unfolded state of the electronic device 100, the third side surface 113c of the first side member 113 and the sixth side surface 123c of the second side member 123 may be connected without a gap formed therebetween. According to an embodiment, in the unfolded state, the electronic device 100 may be configured such that the combined length of the second side surface 113b and the fifth side surface 123b is longer than the combined length of the first side surface 113a and/or the fourth side surface 123a. In addition, the combined length of the third side surface 113c and the sixth side surface 123c may be configured to be longer than the length of the first side surface 113a and/or the fourth side surface 123a.

According to certain embodiments, the first side member 113 and/or the second side member 123 may be formed of a metal, and may further include a polymer injected into the metal. According to an embodiment, the first side member 113 and/or the second side member 123 may include at least one conductive portion 116 and/or 126 electrically segmented through one or more segmenting portions 1161 and 1162 and/or segmenting 1261 and 1262, which may be formed using a polymer. In this case, the at least one conductive portion may be electrically connected to a wireless communication circuit included in the electronic device 100, and may be used as an antenna operating in at least one designated band (e.g., legacy band).

According to certain embodiments, the first rear cover 114 and/or the second rear cover 124 may be formed of, for example, coated or tinted glass, ceramic, polymer, metal (e.g., aluminum, stainless steel or "STS", or magnesium), or a combination thereof.

According to certain embodiments, the flexible display 400 may be disposed to extend from the first surface 111 of the first housing 110 across the hinge mechanism (e.g., hinge mechanism 140 in FIG. 1B) to at least a portion of the third surface 121 of the second housing 120. For example, the flexible display 400 may include a first region 130a substantially corresponding to the first surface 111, a second region 130b corresponding to the second surface 121, and a third region 130c (e.g., the bendable region) connecting the first region 130a and the second region 130b and corresponding to the hinge mechanism (e.g., hinge mechanism 140 in FIG. 1B). According to an embodiment, the electronic device 100 may include a first protection cover 115 (e.g., first protection frame or first decoration member) coupled along the periphery of the first housing 110. According to an embodiment, the electronic device 100 may include a second protection cover 125 (e.g., second protection frame or second decoration member) coupled along the periphery of the second housing 120. According to an embodiment, the first protection cover 115 and/or the second protection cover 125 may be formed of a metal or polymer material. According to an embodiment, the first protection cover 115 and/or the second protection cover 125 may be used as a decorative member. According to an embodiment, the flexible display 400 may be positioned such that the periphery of the first region 130a is interposed between the first housing 110 and the first protection cover 115. According to an embodiment, the flexible display 400 may be positioned such that the periphery of the second region 130b is interposed between the second housing 120 and the second protection cover 125. According to an embodiment, the flexible display 400 may be positioned such that the periphery of the flexible display 400 corresponding to a protection cap 135 is protected through the protection cap disposed in a region corresponding to the hinge mechanism (e.g., hinge mechanism 140 in FIG. 1B). Consequently, the periphery of the flexible display 400 may be substantially protected from the outside. According to an embodiment, the electronic device 100 may include a hinge housing 141 (e.g., hinge cover) that is disposed so as to support the hinge mechanism (e.g., hinge mechanism 140 in FIG. 1B). The hinge housing 141 may further be exposed to the outside when the electronic device 100 is in the folded state, and be invisible as viewed from the outside when retracted into a first space (e.g., internal space of the first housing 110) and a second space (e.g., internal space of the second housing 120) when the electronic device 100 is in the unfolded state. In certain embodiments, the flexible display 400 may be disposed to extend from at least a portion of the second surface 112 to at least a portion of the fourth surface 122. In this case, the electronic device 100 may be folded so that the flexible display 400 is exposed to the outside (out-folding scheme).

According to certain embodiments, the electronic device 100 may include a sub-display 131 disposed separately from the flexible display 400. According to an embodiment, the sub-display 131 may be disposed to be at least partially exposed on the second surface 112 of the first housing 110, and may display status information of the electronic device 100 in place of the display function of the flexible display 400 in case of the folded state. According to an embodiment, the sub-display 131 may be disposed to be visible from the outside through at least some region of the first rear cover 114. In certain embodiments, the sub-display 131 may be disposed on the fourth surface 122 of the second housing 120. In this case, the sub-display 131 may be disposed to be visible from the outside through at least some region of the second rear cover 124.

According to certain embodiments, the electronic device 100 may include at least one of an input device 103 (e.g., microphone), sound output devices 101 and 102, a sensor module 104, camera devices 105 and 108, a key input device 106, or a connector port 107. In the illustrated embodiment, the input device 103 (e.g., microphone), sound output devices 101 and 102, sensor module 104, camera devices 105 and 108, key input device 106, and connector port 107 indicate a hole or shape formed in the first housing 110 or the second housing 120, but may be defined to include a substantial electronic component (e.g., input device, sound output device, sensor module, or camera device) that is disposed inside the electronic device 100 and operated through a hole or a shape.

According to certain embodiments, the input device 103 may include at least one microphone disposed on the second housing 120. In certain embodiments, the input device 103 may include a plurality of microphones disposed to detect the direction of a sound. In certain embodiments, a plurality of microphones may be disposed at appropriate positions in the first housing 110 and/or the second housing 120. According to an embodiment, the sound output devices 101 and 102 may include speakers. According to an embodiment, the input device 103 may include a receiver for calls disposed in the first housing 110, and a speaker disposed in the second housing 120. In certain embodiments, the input device 103, the sound output devices 101 and 102, and the connector port 107 may be disposed in a space arranged in the first housing 110 and/or the second housing 120 of the electronic device 100, and may be exposed to the external environment through at least one hole formed in the first housing 110 and/or the second housing 120. According to an embodiment, at least one connector port 107 may be used to transmit and receive power and/or data to and from an external electronic device. In certain embodiments, at least one connector port (e.g., ear jack hole) may accommodate a connector (e.g., ear jack) for transmitting and receiving an audio signal to and from an external electronic device. In certain embodiments, the hole formed in the first housing 110 and/or the second housing 120 may be commonly used for the input device 103 and the sound output devices 101 and 102. In certain embodiments, the sound output devices 101 and 102 may include a speaker (e.g., piezo speaker) that operates without using a hole formed in the first housing 110 and/or the second housing 120.

According to certain embodiments, the sensor module 104 may generate an electrical signal or data value corresponding to an internal operating state of the electronic device 100 or an external environmental state. The sensor module 104 may detect an external environment, for example, through the first surface 111 of the first housing 110. In certain embodiments, the electronic device 100 may further include at least one sensor module disposed to detect an external environment through the second surface 112 of the first housing 110. According to an embodiment, the sensor module 104 (e.g., illuminance sensor) may be disposed under the flexible display 400 to detect an external environment through the flexible display 400. According to an embodiment, the sensor module 104 may include at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, an illuminance sensor, a proximity sensor, a biometric sensor, an ultrasonic sensor, or an illuminance sensor 104.

According to certain embodiments, the camera devices 105 and 108 may include a first camera device 105 (e.g., front camera device) disposed on the first surface 111 of the first housing 110, and a second camera device 108 disposed on the second surface 112 of the first housing 110. The electronic device 100 may further include a flash 109 disposed close to the second camera device 108. According to an embodiment, the camera device 105 or 108 may include one or more lenses, an image sensor, and/or an image signal processor. The flash 109 may include, for example, a light emitting diode or a xenon lamp. According to an embodiment, the camera devices 105 and 108 may be arranged so that two or more lenses (e.g., wide-angle lens, super-wide-angle lens, or telephoto lens) and image sensors are positioned on one surface (e.g., first surface 111, second surface 112, third surface 121, or fourth surface 122) of the electronic device 100. In certain embodiments, the camera devices 105 and 108 may include time-of-flight (TOF) lenses and/or an image sensor.

According to certain embodiments, the key input device 106 (e.g., key button) may be disposed on the third side surface 113c of the first side member 113 of the first housing 110. In certain embodiments, the key input device 106 may be disposed on at least one of the other side surfaces 113a and 113b of the first housing 110 and/or the side surfaces 123a, 123b and 123c of the second housing 120. In certain embodiments, the electronic device 100 may not include some or all of the key input devices 106, and those not included key input devices 106 may be implemented in other forms, such as soft keys, on the flexible display 400. In certain embodiments, the key input device 106 may be implemented by using a pressure sensor included in the flexible display 400.

According to certain embodiments, some of the camera devices 105 and 108 (e.g., first camera device 105) or the sensor module 104 may be disposed to be exposed through the flexible display 400. For example, the first camera device 105 or the sensor module 104 may be arranged in the internal space of the electronic device 100 so as to be in contact with the external environment through an opening (e.g., through hole) formed at least partially in the flexible display 400. In another embodiment, some sensor modules 104 may be arranged in the internal space of the electronic device 100 so as to perform their functions without being visually exposed through the flexible display 400. For example, in this case, the opening of a region of the flexible display 400 facing the sensor module may be not needed.

With reference to FIG. 2B, the electronic device 100 may be operated to remain in an intermediate state through the hinge mechanism (e.g., hinge device 140 in FIG. 1B). In this case, the electronic device 100 may control the flexible display 400 to display different pieces of content on the display area corresponding to the first surface 111 and the display area corresponding to the third surface 121. According to an embodiment, the electronic device 100 may be operated substantially in an unfolded state (e.g., unfolded state of FIG. 1A) and/or substantially in a folded state (e.g., folded state of FIG. 2A) with respect to a specific inflection angle (e.g., angle between the first housing 110 and the second housing 120 in the intermediate state) through the hinge mechanism (e.g., hinge mechanism 140 in FIG. 1B). For example, when a pressing force is applied in the unfolding direction (B direction) in a state where the electronic device 100 is unfolded at a specific inflection angle, through the hinge mechanism (e.g., hinge mechanism 140 in FIG. 1B), the electronic device 100 may be transitioned to an unfolded state (e.g., unfolded state of FIG. 1A). For example, when a pressing force is applied in the folding direction (C direction) in a state where the electronic device 100 is unfolded at a specific inflection angle, through the hinge mechanism (e.g., hinge mechanism 140 in FIG. 1B), the electronic device 100 may be transitioned to a closed state (e.g., folded state of FIG. 2A). In an embodiment, the electronic device 100 may be operated to remain in an unfolded state at various angles (not shown) through the hinge mechanism (e.g., hinge mechanism 140 in FIG. 1B).

Figure 3:
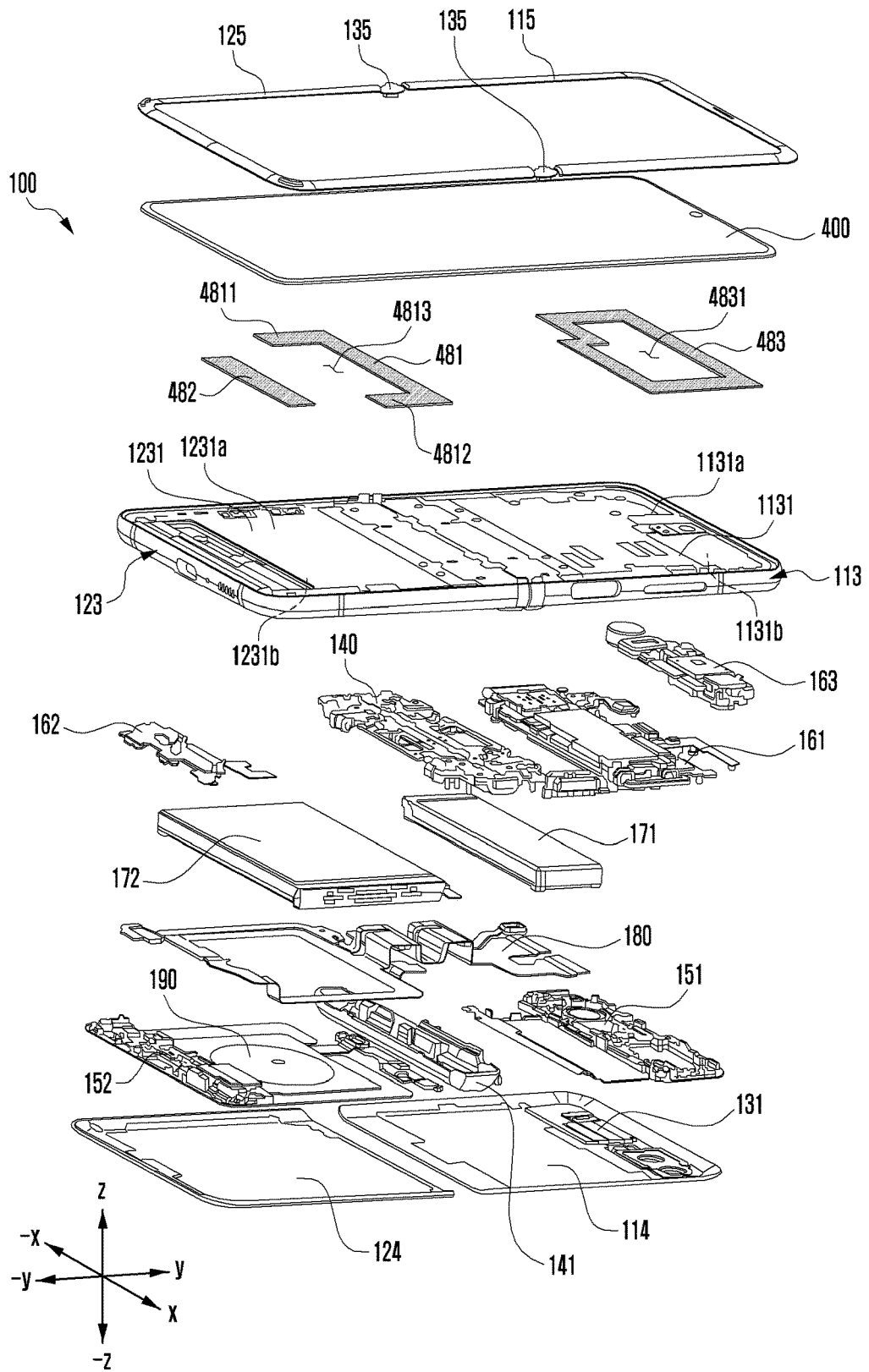
FIG. 3 is an exploded perspective view of the electronic device according to certain embodiments of the disclosure.

FIG. 3 is an exploded perspective view of the electronic device according to certain embodiments of the disclosure.

With reference to FIG. 3, the electronic device 100 may include a first side member 113 (e.g., first side frame), a second side member 123 (e.g., second side frame), and a hinge mechanism 140 (e.g., hinge module) rotatably connecting the first side member 113 and the second side member 123. According to an embodiment, the electronic device 100 may include a first support member 1131 (e.g., first support member) at least partially extending from the first side member 113, and a second support member 1231 at least partially extending from the second side member 123. According to an embodiment, the first support member 1131 may be integrally formed with the first side member 113 or may be structurally coupled to the first side member 113. Similarly, the second support member 1231 may be integrally formed with the second side member 123 or may be structurally coupled to the second side member 123. According to an embodiment, the electronic device 100 may include a flexible display 400 disposed to be supported by the first support member 1131 and the second support member 1231. According to an embodiment, the electronic device 100 may include a first rear cover 114 that is coupled to the first side member 113 and provides a first space between itself and the first support member 1131, and a second rear cover 124 that is coupled to the second side member 123 and provides a second space between itself and the second support member 1231. In certain embodiments, the first side member 113 and the first rear cover 114 may be integrally formed. In certain embodiments, the second side member 123 and the second rear cover 124 may be integrally formed. According to an embodiment, the electronic device 100 may include a first housing 110 (e.g., first housing 110 in FIG. 1A) (e.g., first housing structure) provided through the first side member 113, the first support member 1131, and the first rear cover 114. According to an embodiment, the electronic device 100 may include a second housing (e.g., second housing 120 in FIG. 1A) (e.g., second housing structure) provided through the second side member 123, the second support member 1231, and the second rear cover 124. According to an embodiment, the electronic device 100 may include a sub-display 131 that is disposed to be visible from the outside through at least some region of the first rear cover 114.

According to certain embodiments, the electronic device 100 may include a first substrate assembly 161 (e.g., main printed circuit board), a camera assembly 163, a first battery 171, or a first bracket 151, arranged in the first space between the first side member 113 and the first rear cover 114. According to an embodiment, the camera assembly 163 may include a plurality of camera devices (e.g., camera devices 105 and 108 in FIGS. 1A and 2A), and may be electrically connected to the first substrate assembly 161. According to an embodiment, the first bracket 151 may provide a support structure for supporting the first substrate assembly 161 and/or the camera assembly 163, and improved rigidity. According to an embodiment, the electronic device 100 may include a second board assembly 162 (e.g., sub printed circuit board), an antenna 190 (e.g., coil member), a second battery 172, or a second bracket 152, arranged in the second space between the second side member 123 and the second rear cover 124. According to an embodiment, the electronic device 100 may include a wiring member 180 (e.g., FPCB) extending from the first substrate assembly 161 across the hinge mechanism 140 to a plurality of electronic components arranged between the second side member 123 and the second rear cover 124, to provide electrical connections therebetween. According to an embodiment, the antenna 190 may include a near field communication (NFC) antenna, a wireless charging antenna, and/or a magnetic secure transmission (MST) antenna. The antenna 190 may, for example, perform short-range communication with an external device or wirelessly transmit and receive power utilized for charging.

According to certain embodiments, the electronic device 100 may include a hinge housing 141 (e.g., hinge cover) that supports the hinge mechanism 140 and is disposed so as to be exposed to the outside when the electronic device 100 is in the folded state (e.g., folded state of FIG. 2A) and be invisible from the outside by being retracted into the first space and/or the second space when the electronic device 100 is in the unfolded state (e.g., unfolded state of FIG. 1A).

According to certain embodiments, the electronic device 100 may include a first protection cover 115 coupled along the periphery of the first side member 113. According to an embodiment, the electronic device 100 may include a second protection cover 125 coupled along the periphery of the second side member 123. According to an embodiment, in the flexible display 400, the periphery of a first flat portion (e.g., first flat portion 130a in FIG. 1B) may be protected by the first protection cover 115. According to an embodiment, in the flexible display 400, the periphery of a second flat portion (e.g., second flat portion 130b in FIG. 1B) may be protected by the second protection cover 125. According to an embodiment, the electronic device 100 may include a protection cap 135 that protects the periphery of the third region (e.g., third region 130c in FIG. 1B) of the flexible display 400 corresponding to the hinge mechanism 140.

According to certain embodiments, the first support member 1131 may include a first support surface 1131a facing a first direction (z-axis direction), and a second support surface 1131b facing a second direction (negative z-axis direction) opposite to the first direction. According to an embodiment, the second support member 1231 may include a third support surface 1231a facing the first direction, and a fourth support surface 1231b facing the second direction in the unfolded state. According to an embodiment, the flexible display 400 may be supported by the first support surface 1131a of the first support member 1131 and the third support surface 1231a of the second support member 1231.

According to certain embodiments, the flexible display 400 may include an extension portion (e.g., extension portion 4321 in FIG. 4) extending from the display panel (e.g., display panel 430 in FIG. 4), and a bending portion (e.g., bending portion 432 in FIG. 4) including a flexible substrate (e.g., flexible substrate 4322 in FIG. 4) (e.g., the FPCB) connected to the extension portion 4321. According to an embodiment, the bending portion 432 may be bent in the second direction (negative z-axis direction) from the flexible display, and may be disposed by attachment to the rear surface of the flexible display 400. According to an embodiment, the bending portion 432 may include a control circuit (e.g., control circuit 4321a in FIG. 4) for controlling driving of the flexible display, and a plurality of electrical elements (e.g., electrical elements 4322a in FIG. 5A).

According to certain embodiments, the electronic device 100 may include at least one waterproof member (481 and 482, 484 and 483 in FIG. 5A) disposed between the flexible display 400 and the second support member 1231, and between the flexible display 400 and the first support member 1131. According to an embodiment, the at least one waterproof member (481 and 482, 484 in FIG. 5A) may include a first waterproof member 481 that is disposed between the flexible display 400 and the second support member 1231 to substantially surround the bending portion 432, a second waterproof member 482 disposed between the extension portion (e.g., extension portion 4321 in FIG. 4) and the second support member 1231, and a third waterproof member (e.g., third waterproof member 484 in FIG. 5A) that connects one end 4811 of the first waterproof member 481 and one end of the second waterproof member 482 and connects the other end 4812 of the first waterproof member 481 and the other end of the second waterproof member 482. According to an embodiment, the at least one waterproof member 483 may also include a fourth waterproof member 483 having a closed loop shape, and disposed between the flexible display 400 and the first support member 1131. According to an embodiment, the control circuit (e.g., control circuit 4321a in FIG. 4) and plural electrical elements (e.g., electrical elements 4322a in FIG. 5A) disposed on the bending portion 432 are disposed in a sealed first waterproof space 4813 that is formed through the first waterproof member 481, the second waterproof member 482, and the third waterproof member (e.g., third waterproof member 484 in FIG. 5A) between the flexible display 400 and the second support member 1231, and are thereby protected from external moisture and/or foreign substances. According to an embodiment, one or more electronic components (e.g., a sensor module, such as the sensor module 104 in FIG. 1A) and/or a camera device (e.g., the camera device 105 in FIG. 1A) arranged through the first support member 1131 are disposed in a second waterproof space 4831 formed by the closed loop shape of the fourth waterproof member 483 between the flexible display 400 and the first support member 1131, and are thereby protected from external moisture and/or foreign substances.

Figure 4:
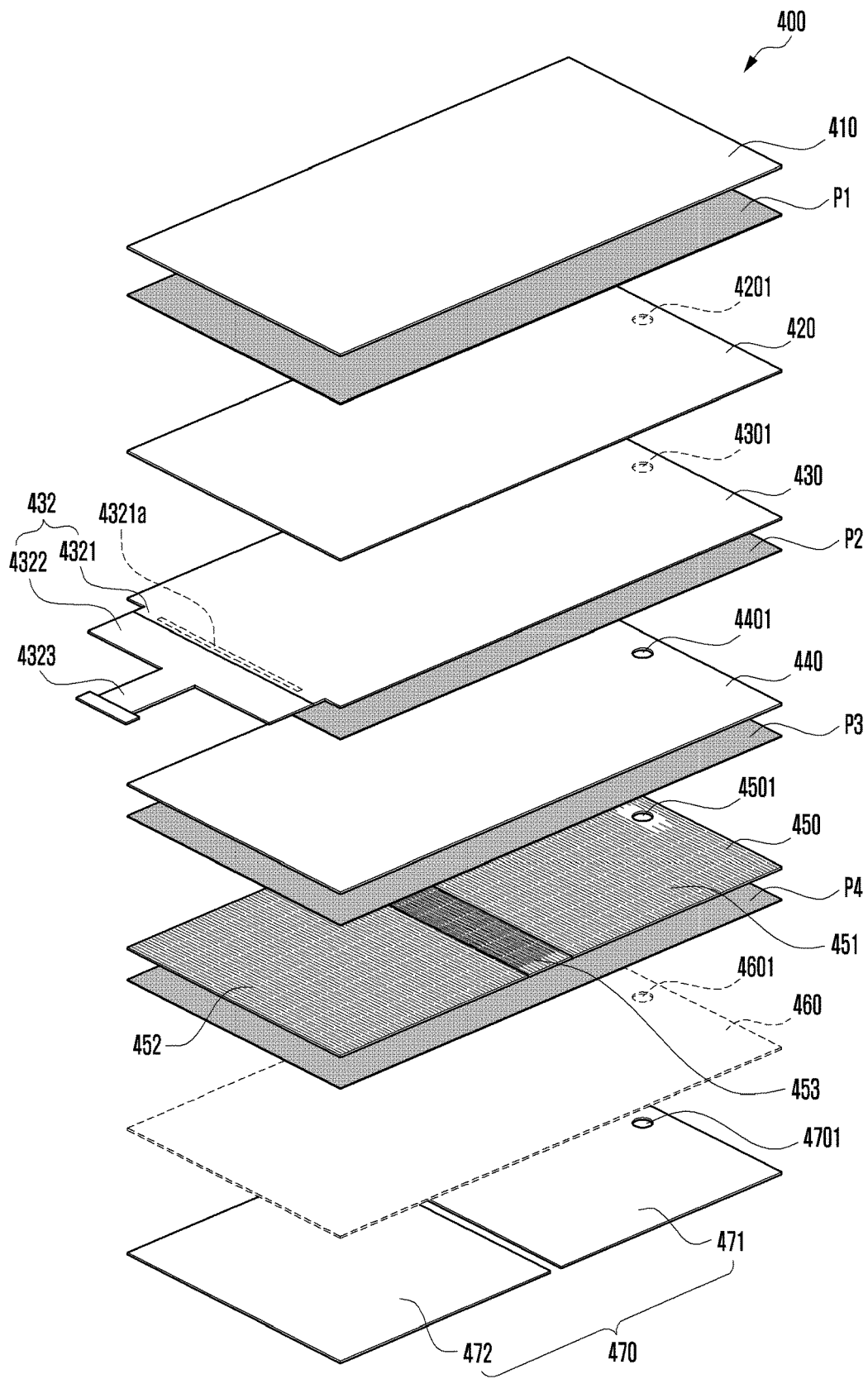
FIG. 4 is an exploded perspective view of a flexible display 400 according to certain embodiments of the disclosure.

FIG. 4 is an exploded perspective view of the flexible display according to certain embodiments of the disclosure.

The display (e.g., flexible display 400) according to example embodiments of the disclosure may include an "unbreakable" (UB) type OLED display (e.g., curved display). However, without being limited thereto, the flexible display 400 may include a flat type display based on OCTA (on-cell touch active matrix organic light-emitting diode or "AMOLED").

With reference to FIG. 4, the flexible display 400 may include, in addition to a window layer 410, a polarizing layer (polarizer or "POL") 420 (e.g., polarizing film), a display panel 430, a polymer layer 440, a metal sheet layer 450, and a reinforcement plate 470, which are disposed in sequence on the rear surface of the window layer 410. In certain embodiments, the flexible display 400 may also include a digitizer 460 disposed between the polymer layer 440 and the metal sheet layer 450 or between the metal sheet layer 450 and the reinforcement plate 470.

According to certain embodiments, the window layer 410 may include a glass layer. According to an embodiment, the window layer 410 may include ultra-thin glass (UTG). In certain embodiments, the window layer 410 may include a polymer. In this case, the window layer 410 may include polyethylene terephthalate (PET) or polyimide (PI). In certain embodiments, the window layer 410 may be disposed as a plurality of layers to include a glass layer and a polymer.

According to certain embodiments, the window layer 410, the polarizing layer 420, the display panel 430, the polymer layer 440, and the metal sheet layer 450 may be arranged to cross at least some of the first surface (e.g., first surface 111 in FIG. 1A) of the first housing (e.g., first housing 110 in FIG. 1A) and the third surface (e.g., third surface 121 in FIG. 1A) of the second housing (e.g., second housing 120 in FIG. 1A). According to an embodiment, the reinforcement plate 470 may include a first reinforcement plate 471 facing the first housing (e.g., first housing 110 in FIG. 1A), and a second reinforcement plate 472 facing the second housing (e.g., second housing 120 in FIG. 1A). According to an embodiment, the window layer 410, the polarizing layer 420, the display panel 430, the polymer layer 440, the metal sheet layer 450, and the reinforcement plate 470 may be attached to one another through a pressure sensitive adhesive (e.g., P1, P2, P3, P4, or alternatively, a normal adhesive). For example, the adhesives P1, P2, P3 and P4 may include at least one of an optical clear adhesive (OCA), a pressure sensitive adhesive (PSA), a heat-responsive adhesive, a general adhesive, or a double-sided tape.

According to certain embodiments, the display panel 430 may include a plurality of pixels and a wiring structure (e.g., an electrode pattern). According to an embodiment, the polarizing layer 420 may selectively pass light that is generated from the light source of the display panel 430 and vibrates in a specific direction. According to an embodiment, the display panel 430 and the polarizing layer 420 may be integrally formed. According to an embodiment, the flexible display 400 may also include a touch panel (not shown).

According to certain embodiments, the polymer layer 440 may be disposed under the display panel 430 to provide a dark background for improving the visibility of the display panel 430 and may be formed of a buffer material for cushioning. In certain embodiments, for waterproofing of the flexible display 400, the polymer layer 440 may be removed or disposed under the metal sheet layer 450.

According to certain embodiments, the metal sheet layer 450 may facilitate the bending characteristics of the flexible display 400. For example, the metal sheet layer 450 may include a first flat portion 451 corresponding to the first surface (e.g., first surface 111 in FIG. 1A) of the first housing (e.g., first housing 110 in FIG. 1A), a second flat portion 452 corresponding to the third surface (e.g., third surface 121 in FIG. 1A) of the second housing (e.g., second housing 120 in FIG. 1A), and a bendable portion 453 that corresponds to the hinge mechanism (e.g., hinge mechanism 140 in FIG. 1B) connecting the first flat portion 451 and the second flat portion 452. According to an embodiment, the metal sheet layer 450 may include at least one of steel use stainless (SUS) (e.g., stainless steel or "STS"), Cu, Al, or metal CLAD (e.g., laminated member in which SUS and Al are alternately arranged). In certain embodiments, the metal sheet layer 450 may include other alloy materials. In certain embodiments, the metal sheet layer 450 may help to reinforce rigidity of the electronic device (e.g., electronic device 100 in FIG. 1A), shield the device from ambient noise, and dissipate heat emitted from thermal emission components.

According to certain embodiments, the display 400 may include a digitizer 460 disposed under the metal sheet layer 450 as a detection member capable of receiving input from an electronic pen (e.g., stylus). For example, the digitizer 460 may include a coil member disposed on a dielectric substrate to detect a resonance frequency applied from the electronic pen through electromagnetic induction.

According to certain embodiments, the flexible display 400 may include at least one functional member (not shown) disposed between the polymer layer 440 and the metal sheet layer 450 or under the metal sheet layer 450. According to an embodiment, the functional member may include a graphite sheet for heat dissipation, an added display, a force touch FPCB, a fingerprint sensor FPCB, an antenna radiator for communication, or a conductive/non-conductive tape. According to an embodiment, when bending is not possible, the functional members may be separately disposed in the first housing (e.g., first housing 110 in FIG. 1A) and the second housing (e.g., second housing 120 in FIG. 1A). According to an embodiment, when bending is possible, the functional member may be disposed from the first housing (e.g., first housing 110 in FIG. 1A) through the hinge mechanism (e.g., hinge mechanism 140 in FIG. 1B) to at least some of the second housing (e.g., second housing 120 in FIG. 1A).

According to certain embodiments, the electronic device (e.g., electronic device 100 in FIG. 1A) may include a camera device (e.g., first camera device 105 in FIG. 1A) that is disposed under the flexible display 400 to sense an external environment through the flexible display 400. In certain embodiments, the electronic device (e.g., electronic device 100 in FIG. 1A) may include at least one sensor module (e.g., sensor module 104 in FIG. 1A) (e.g., illuminance sensor, proximity sensor, or TOF sensor) disposed under the flexible display 400. According to an embodiment, the polarizing layer 420, the display panel 430, the polymer layer 440, the metal sheet layer 450, and the reinforcement plate 470 may include a through hole 4201, 4301, 4401, 4501 or 4601. In certain embodiments, the display panel 430 and/or the polarizing layer 420 may not require the through holes 4201 and 4301 through adjustment of the transmittance of the corresponding region. In certain embodiments, the sizes of the through holes 4201, 4301, 4401, 4501 and 4601 may be set based on the size and/or angle of view of the camera device (e.g., first camera device 105 in FIG. 1A), and the sizes of the through holes 4201, 4301, 4401, 4501 and 4601 may be different from one another.

According to certain embodiments, the flexible display 400 may include a bending portion 432 disposed in a folded manner from the display panel 430 to at least some region of the rear surface of the flexible display 400. According to an embodiment, the bending portion 432 may include an extension portion 4321 extending from the display panel 430 and including a control circuit 4321a, and a flexible substrate 4322 electrically connected to the extension portion 4321 and including a plurality of electrical elements. According to an embodiment, the control circuit 4311 may include a display driver IC (DDI) or a touch display driver IC (TDDI) mounted on the extension portion 4321 having an electrical wiring structure. According to an embodiment, the control circuit 4321a may have a chip-on-panel or chip-on-plastic (COP) structure directly arranged on the extension portion 4321. In certain embodiments, the control circuit may have a chip-on-film (COF) structure mounted on a separate connection film (not shown) connecting the extension portion 4321 and the flexible substrate 4322. According to an embodiment, the flexible display 400 may include a plurality of electrical elements 4322a arranged on the flexible substrate 4322. According to an embodiment, the flexible display 400 may include a connector portion 4323 that extends from the flexible substrate 4322 and is electrically connected to a substrate (e.g., second printed circuit board 162 in FIG. 3) of the electronic device (e.g., electronic device 100 in FIG. 3). According to an embodiment, the plurality of electrical elements 4322a may include a touch IC, a flash memory for displaying, an ESD prevention diode, a pressure sensor, or a passive element such as a decoupling capacitor. In another embodiment, when the bending portion 432 is disposed in a region of the flexible display 400 facing the first housing (e.g., first housing 110 in FIG. 1), the connector portion 4323 may be electrically connected to another substrate (e.g., first printed circuit board 171 in FIG. 3) of the electronic device (e.g., electronic device 100 in FIG. 3).

According to certain embodiments of the disclosure, the electronic device (e.g., electronic device 100 in FIG. 3) may include a waterproof/dustproof structure that is bent toward the rear surface of the flexible display 400, and protects the bending portion 432 including a control circuit and plural electrical elements from external moisture and/or foreign substances.

Next, a detailed description will be given of a waterproof/dustproof structure provided in the electronic device 100 for the bending portion 432.

Figure 5A:
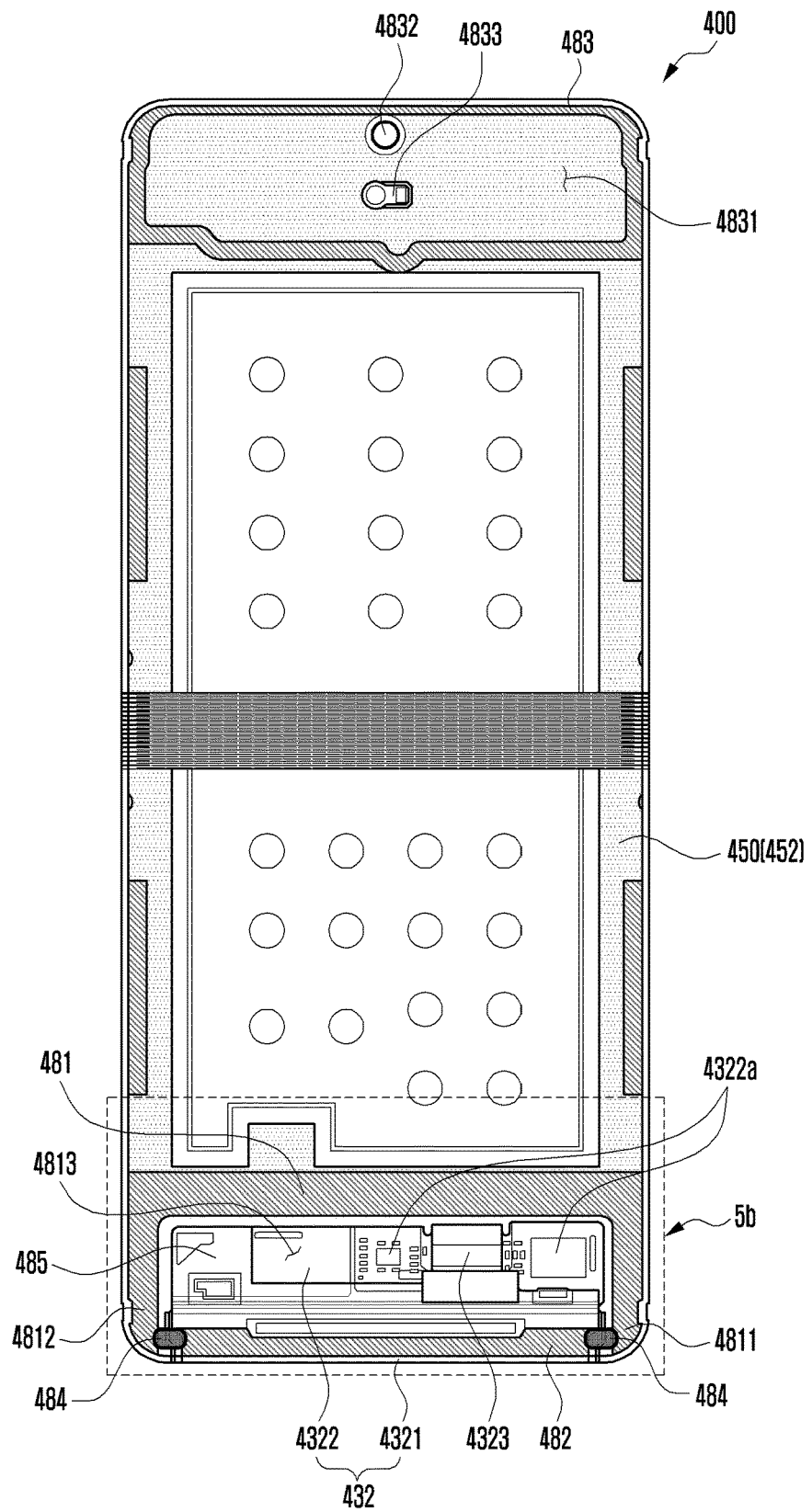
FIG. 5A is a plan view illustrating the back of the flexible display according to certain embodiments of the disclosure.
Figure 5B:
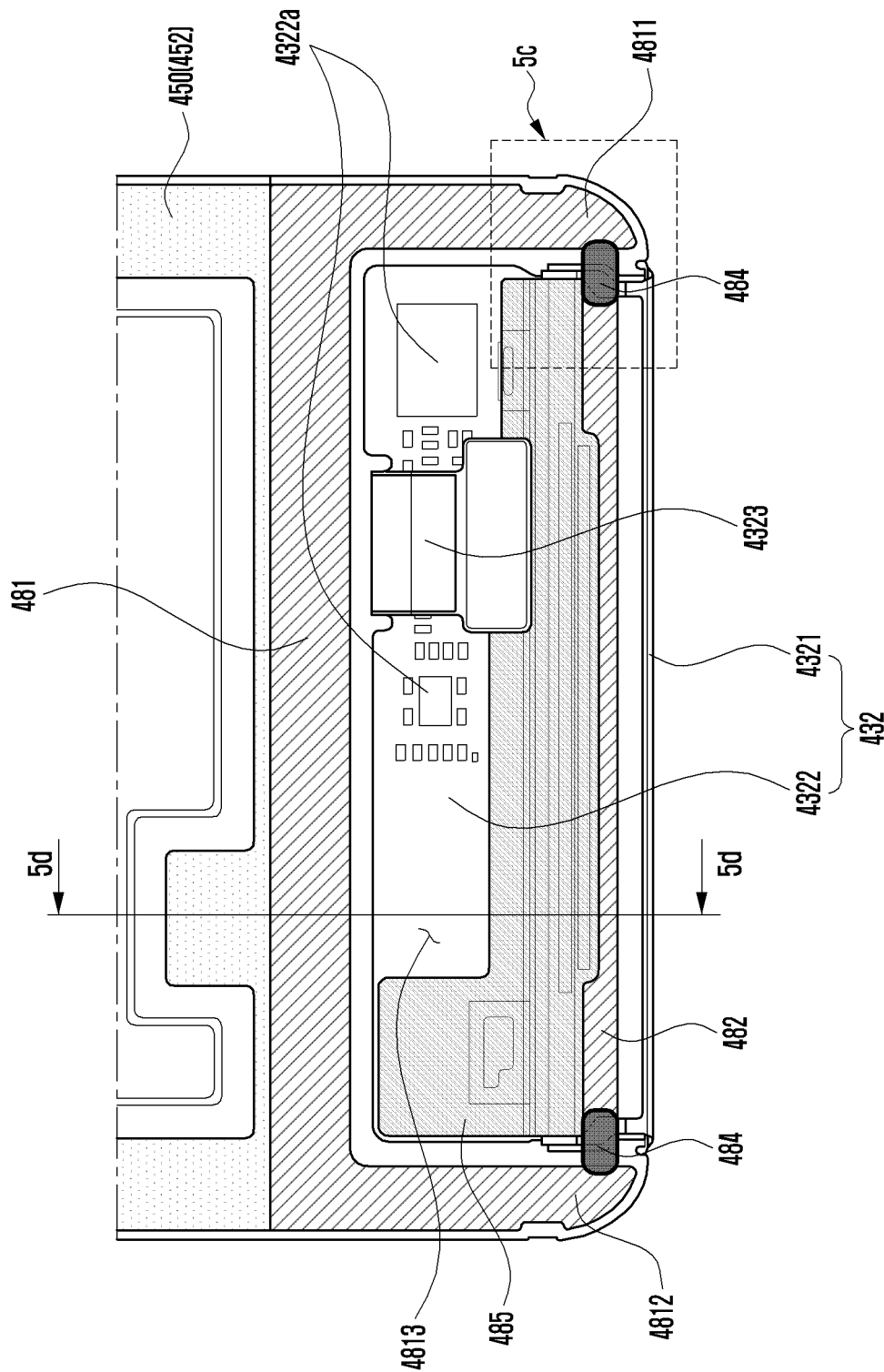
FIG. 5B is an enlarged view of region 5b shown in FIG. 5A according to certain embodiments of the disclosure.
Figure 5C:
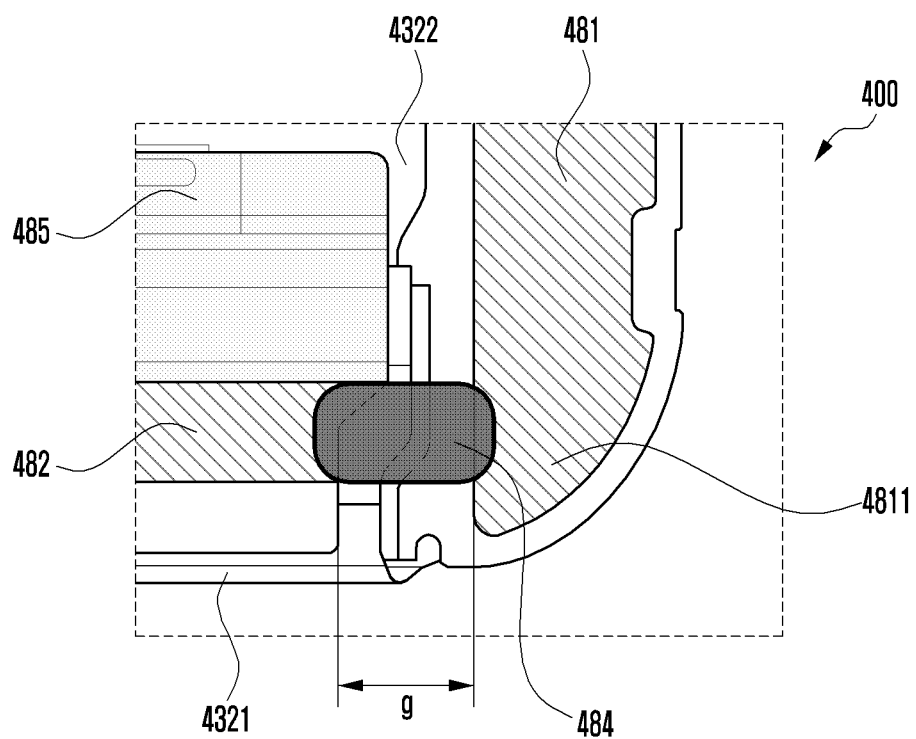
FIG. 5C is an enlarged view of region 5c shown in FIG. 5B according to certain embodiments of the disclosure.
Figure 5D:
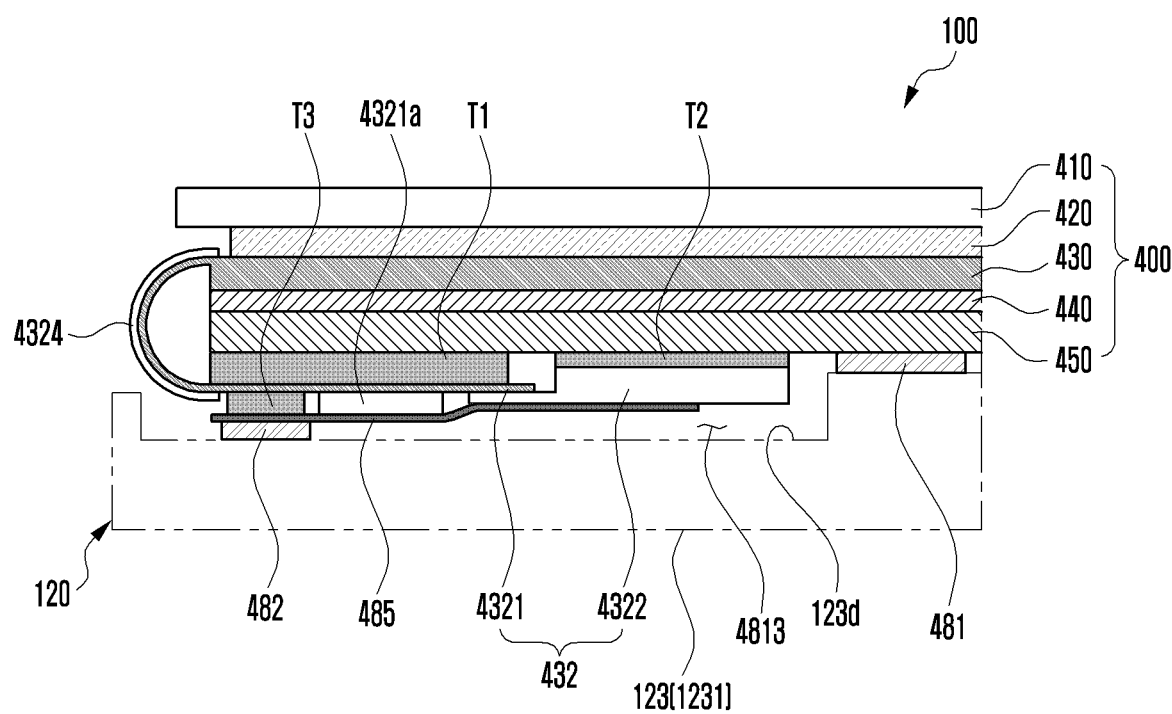
FIG. 5D is a partial cross-sectional view of the display viewed along line 5d-5d of FIG. 5B according to certain embodiments of the disclosure.
Figure 5E:
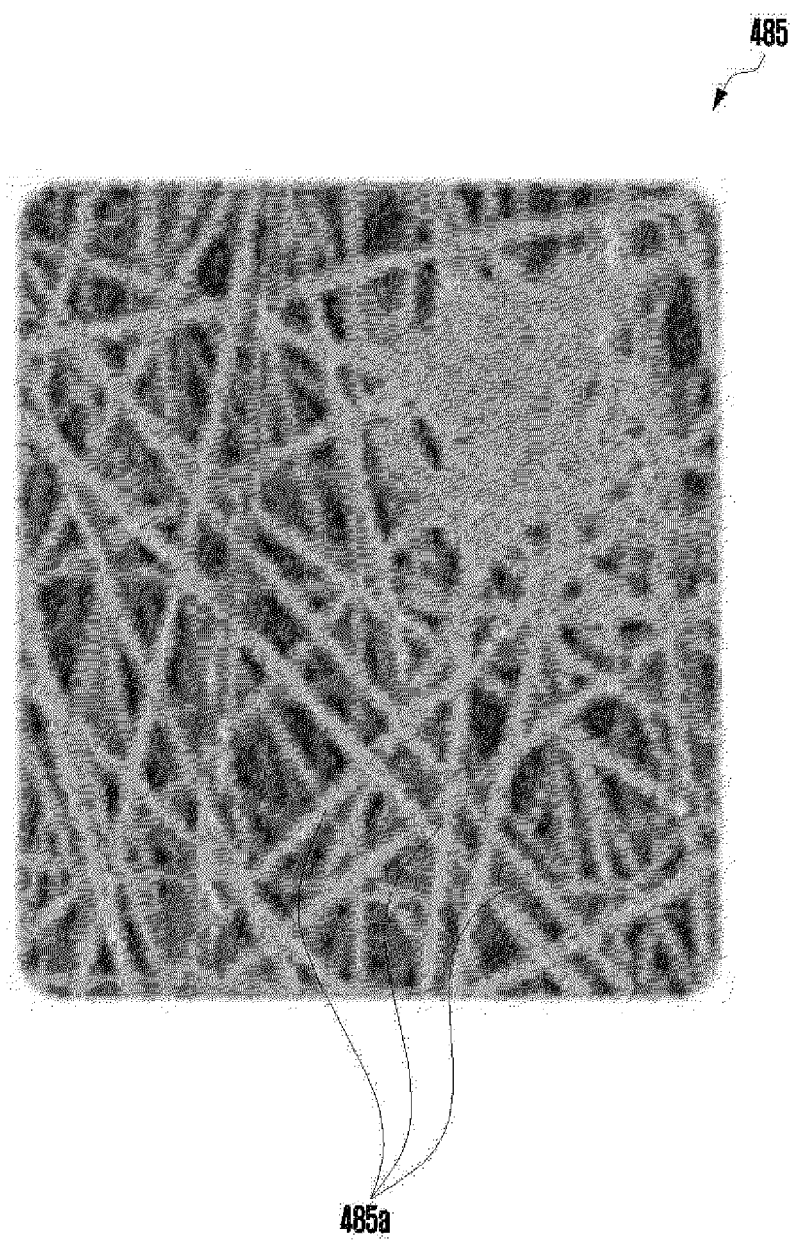
FIG. 5E is an enlarged view of the internal structure of a cover tape according to certain embodiments of the disclosure.

FIG. 5A is a plan view illustrating the back of the flexible display according to certain embodiments of the disclosure. FIG. 5B is an enlarged view of region 5b shown in FIG. 5A according to certain embodiments of the disclosure. FIG. 5C is an enlarged view of region 5c shown in FIG. 5B according to certain embodiments of the disclosure. FIG. 5D is a partial cross-sectional view of the display viewed along line 5d-5d of FIG. 5B according to certain embodiments of the disclosure. FIG. 5E is an enlarged view of the internal structure of a cover tape according to certain embodiments of the disclosure.

With reference to FIGS. 5A to 5E, the electronic device 100 may include a flexible display 400 supported by the first support member 1131 of the first housing 110 and the second support member 1231 of the second housing 120. According to an embodiment, the flexible display 400 may include a bending portion 432 extending outward from the display panel (e.g., display panel 430 in FIG. 4), and disposed on the rear surface of the flexible display 400. According to an embodiment, the flexible display 400 may further include a bending protection layer 4324 (e.g., bending protection layer or "BPL") laminated on the outer surface of the bending portion 432, to protect the bending portion 432. According to an embodiment, the bending portion 432 may include an extension portion 4321 that extends from the display panel (e.g., display panel 430 in FIG. 4) and includes a control circuit 4321a, and a flexible substrate 4322 that is connected to the extension portion 4321 and includes a plurality of electrical elements 4322a. According to an embodiment, the bending portion 432 may be bent towards the rear surface of the flexible display 400 and then attached to the metal sheet layer 450. In certain embodiments, the ground of the flexible substrate 4322 may be electrically connected to the metal sheet layer 450 to help prevent malfunction (e.g., flickering) of the flexible display. As shown in FIG. 5A, the bending portion 432 may be disposed to face at least some of the second flat portion 452 of the metal sheet layer 450 corresponding to the second support member 1231 of the second housing 120. In this case, the second support member 1231 may include a recess (e.g., recess 123d in FIG. 5D) formed to be lower than the outer surface to accommodate the bending portion 432. In certain embodiments, the bending portion 432 may be disposed at a position facing the first flat portion 451 of the metal sheet layer 450 corresponding to the first support member 1131 of the first housing 110.

According to certain embodiments, the electronic device 100 may include at least one waterproof member 481, 482 and 484. According to an embodiment, the at least one waterproof member 481, 482 and 484 may include a first waterproof member 481 that is disposed to substantially surround the bending portion 432 between the metal sheet layer 450 and the second support member 1231 of the flexible display 400, a second waterproof member 482 disposed between the extension portion 4321 and the second support member 1231, and a third waterproof member 484 that connects one end 4811 of the first waterproof member 481 and one end of the second waterproof member 482 and connects the other end 4812 of the first waterproof member 481 and the other end of the second waterproof member 482. According to an embodiment, the first waterproof member 481 and the second waterproof member 482 may include at least one of tape, adhesive, silicone, waterproof rubber, or urethane. According to an embodiment, when the first waterproof member 481 and the second waterproof member 482 are integrally formed, moisture or foreign substances may be introduced through the gap formed by the height difference (step) between the bending portion 432 and the metal sheet layer 450. According to an example embodiment of the disclosure, the first waterproof member 481 and the second waterproof member 482 may be attached separately so as to be spaced apart by a specified interval (g) at the above-described stepped portion, and the stepped portion including the corresponding interval may be connected without a gap formed therebetween through the third waterproof member 484. According to an embodiment, the third waterproofing member 484 may include a waterproofing filling member that includes semi-solid or liquid materials to have a property of being solidified by natural or external conditions (e.g., heat, ultraviolet rays, or pressure). Hence, the control circuit 4321a and the plurality of electrical elements 4322a are arranged inside a first waterproof space 4813 that is formed through the first waterproof member 481, the second waterproof member 482, and the third waterproof member 484 between the flexible display 400 and the second support member 1231 and has a closed-loop shape without a discontinuity due to the step structure, and thus can be protected from moisture and/or foreign substances introduced from the outside.

According to certain embodiments, the extension portion 4321 of the bending portion 432 may be attached to the metal sheet layer 450 through a first adhesive member T1 on the rear surface of the flexible display 400. According to an embodiment, the flexible substrate 4322 may be attached to the metal sheet layer 450 through a second adhesive member T2. For instance, the first adhesive member T1 is a tape member having a specified thickness and may act as a spacer having a thickness for compensating for the height difference between the bending portion 432 and the flexible substrate 4322. According to an embodiment, the first adhesive member T1 may be implemented using a waterproof member because it is exposed to the outside. According to an embodiment, the first adhesive member T1 may include a material in which PET or close-type foam and PET are combined.

According to an embodiment, the second adhesive member T2 may include a conductive tape for electrically connecting the ground of the flexible substrate 4322 to the metal sheet layer 450.

According to certain embodiments, the control circuit 4321a disposed on the extension portion 4321 may be sealed through cover tape 485 attached to extend from at least some of the flexible substrate 4322 to at least some of the extension portion 4321. According to an embodiment, the control circuit 4321a may be sealed by being disposed between the flexible substrate 4322 and the third adhesive member T3 disposed between the cover tape 485 and the extension portion 4321. According to an embodiment, when the electronic device 100 transitions from the folded state to the unfolded state, the bending portion 432 of the display 400 may not have a waterproof structure because an interlayer slip occurs. Hence, the third adhesive member T3 is disposed between the bending protection layer 4324 and the control circuit 4321a where no interlayer slip occurs, and thus can seal the control circuit 4321a from the outside without interfering with an interlayer slip. According to an embodiment, the second waterproof member 482 may be attached to the outer surface of the cover tape 485. In this case, since the cover tape 485 is in direct contact with external moisture and/or foreign substances, it may be advantageous to have a waterproof structure by itself. For example, as shown in FIG. 5E, the cover tape 485 may include a conductive nonwoven fabric for preventing external moisture penetration by having irregularly arranged conductive fiber textures 485a.

Figure 5F:
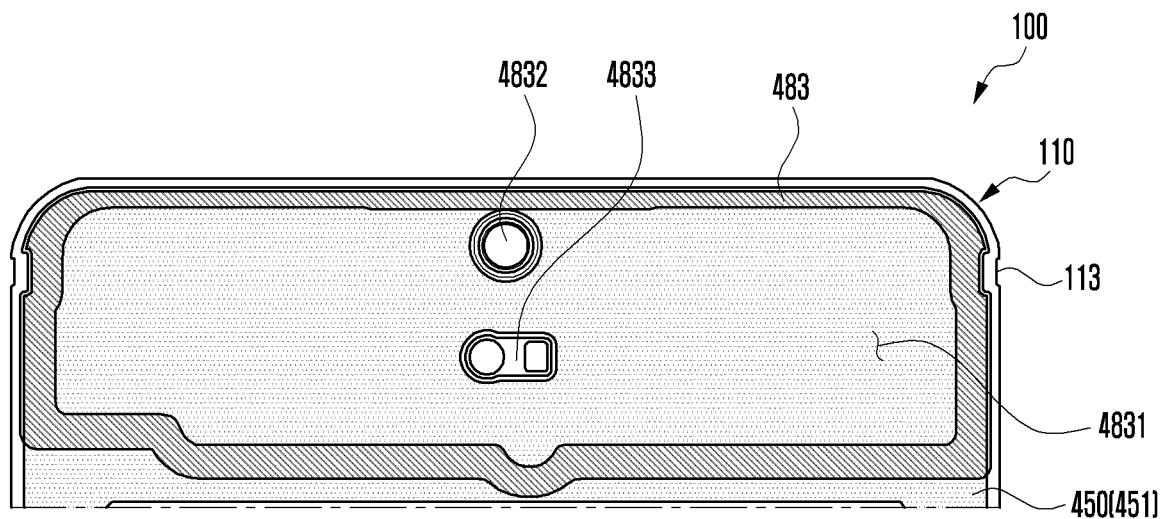
FIG. 5F is a partial configuration view of the display on which a fourth adhesive member is disposed according to certain embodiments of the disclosure.

FIG. 5F is a partial configuration view of the display on which a fourth adhesive member is disposed according to certain embodiments of the disclosure.

With reference to FIG. 5F, the electronic device 100 may include a fourth waterproof member 483 having a closed loop shape disposed between the metal sheet layer 450 and the first support member 1131 of the flexible display 400. According to an embodiment, the fourth waterproof member 483 may provide a sealed second waterproof space 4831. According to an embodiment, the electronic device 100 may include at least one electronic component arranged in a first arrangement region 4832 and a second arrangement region 4833 provided in the first support member 1131 corresponding to the second waterproof space 4831. According to an embodiment, the at least one electronic component may include a camera device (e.g., camera device 105 in FIG. 1A) disposed in the first arrangement region 4832, and a sensor module (e.g., sensor module 104 in FIG. 1A) disposed in the second arrangement region 4833. Hence, the at least one electronic component is arranged in the second waterproof space 4831 that is formed to be sealed by the metal sheet layer 450, the fourth waterproof member 483, and the first support member 1131 of the flexible display 400, and thus can be protected from external moisture and/or foreign substances.

Figure 6A:
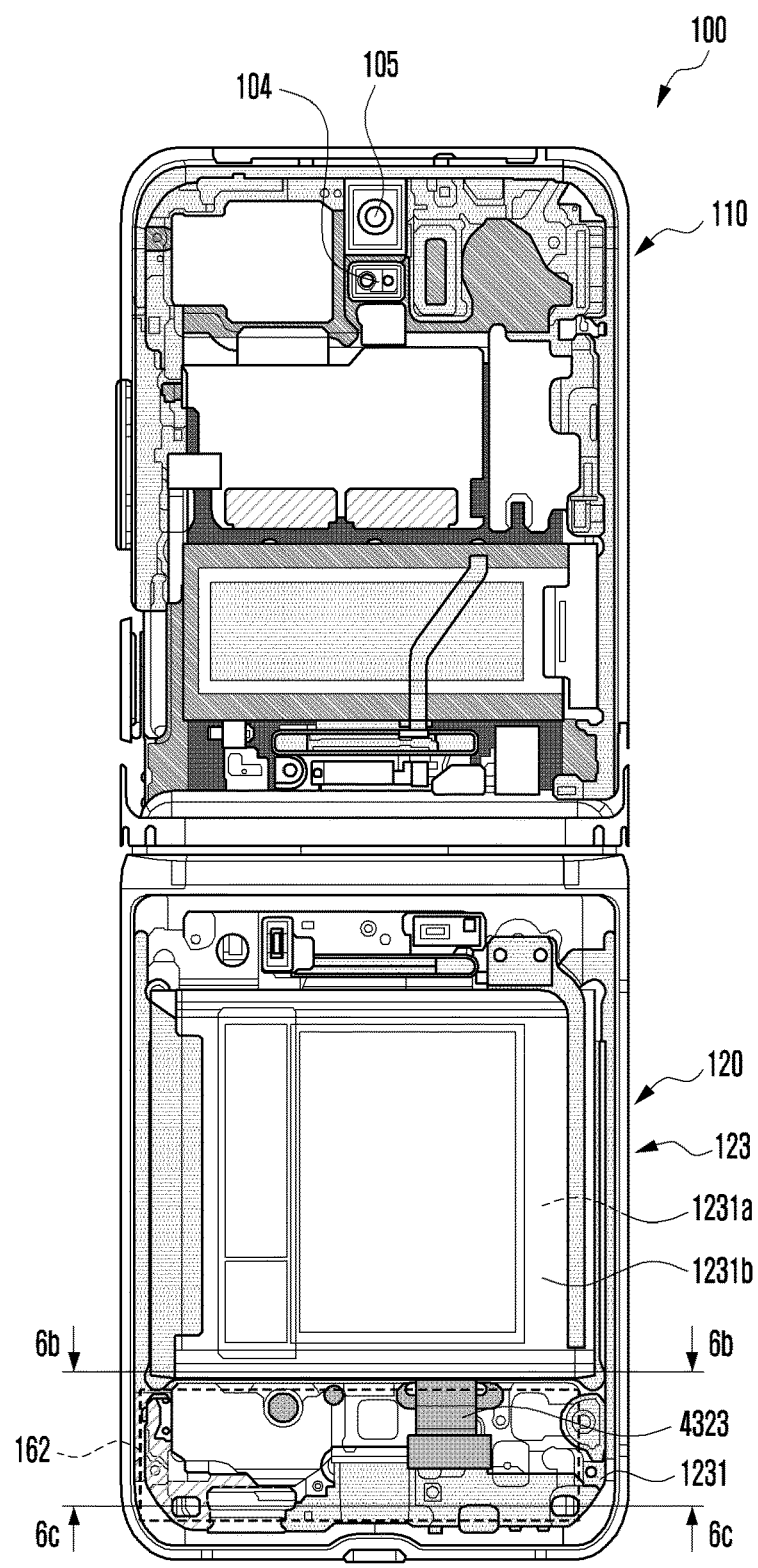
FIG. 6A is a configuration view of the electronic device whose first and second rear covers are removed according to certain embodiments of the disclosure.
Figure 6B:
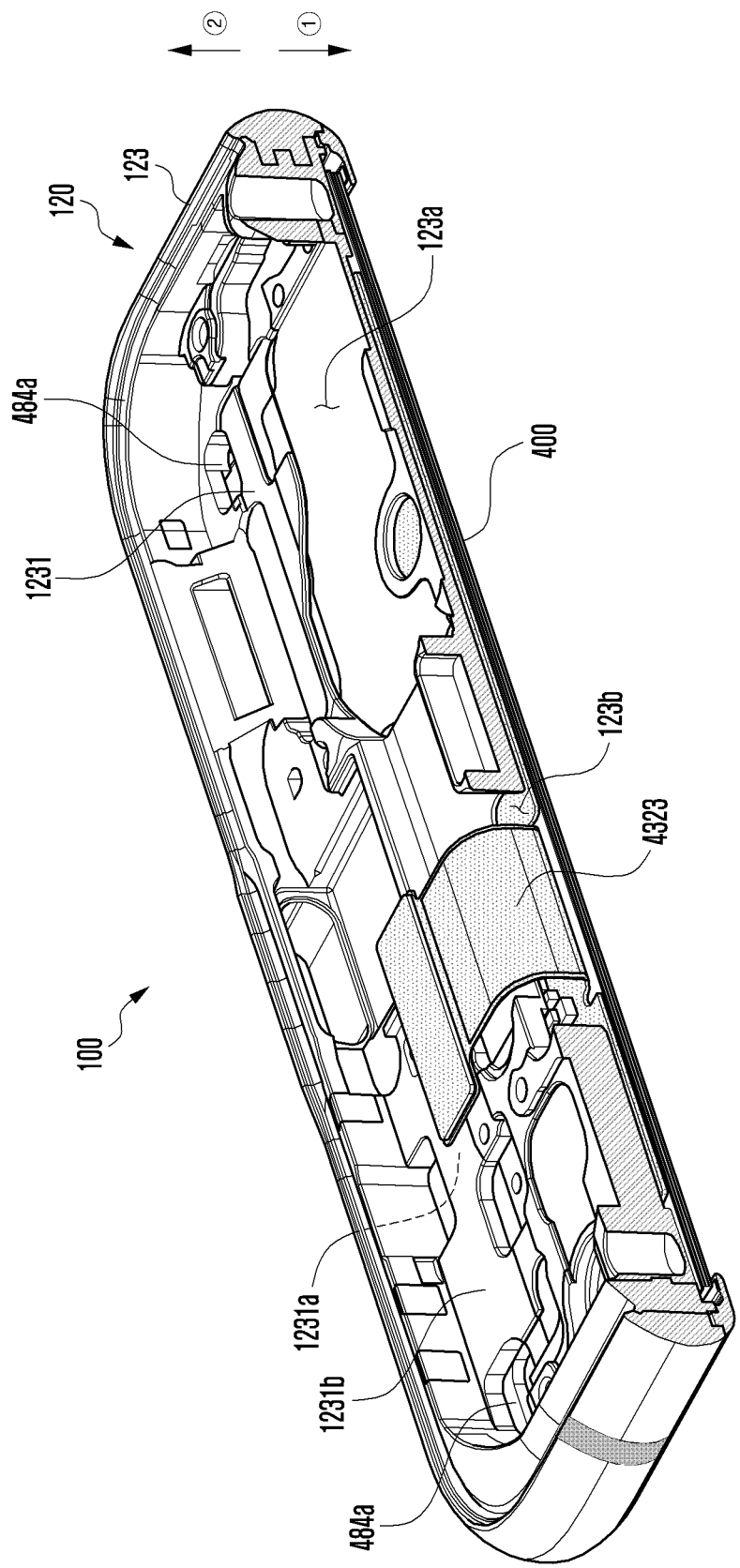
FIG. 6B is a cross-sectional perspective view of a second side member viewed along line 6b-6b of FIG. 6A according to certain embodiments of the disclosure.

FIG. 6A is a configuration view of the electronic device whose first and second rear covers are removed according to certain embodiments of the disclosure. FIG. 6B is a cross-sectional perspective view of the second side member viewed along line 6b-6b of FIG. 6A according to certain embodiments of the disclosure.

With reference to FIGS. 6A and 6B, the flexible substrate 4322 of the bending portion 432 may include a connector portion 4323 extended to a specified length. According to an embodiment, the connector portion 4323 may be electrically connected to a substrate 162 (e.g., second printed circuit board 162 in FIG. 3) disposed to face the fourth support surface 1231b of the second support member 1231. Hence, the connector portion 4323 is electrically connected to the substrate 162 through a through hole formed from the third support surface 1231a to the fourth support surface 1231b, at a position overlapping the first waterproof space 4813 when the flexible display 400 is viewed from above, and thus may help maintain the waterproof function of the first waterproof space 4813 formed through the first waterproof member 481, the second waterproof member 482, and the third waterproof member 483. In certain embodiments, the first waterproof space 4813 may be formed in an at least partially open loop shape. In this case, this partially open portion can be blocked by other electronic component and/or structural modifications of the housing. In certain embodiments, when the connector portion 4323 is disposed to cross the sealed first waterproof member 481 and/or second waterproof member 482, the corresponding portion of the first waterproof member 481 and/or the second waterproof member 482 may have a different thickness from neighboring portions, thereby helping to form a sealing structure. For example, the corresponding portion may be formed to have a thinner or thicker thickness compared with the neighboring portions.

Figure 6C:
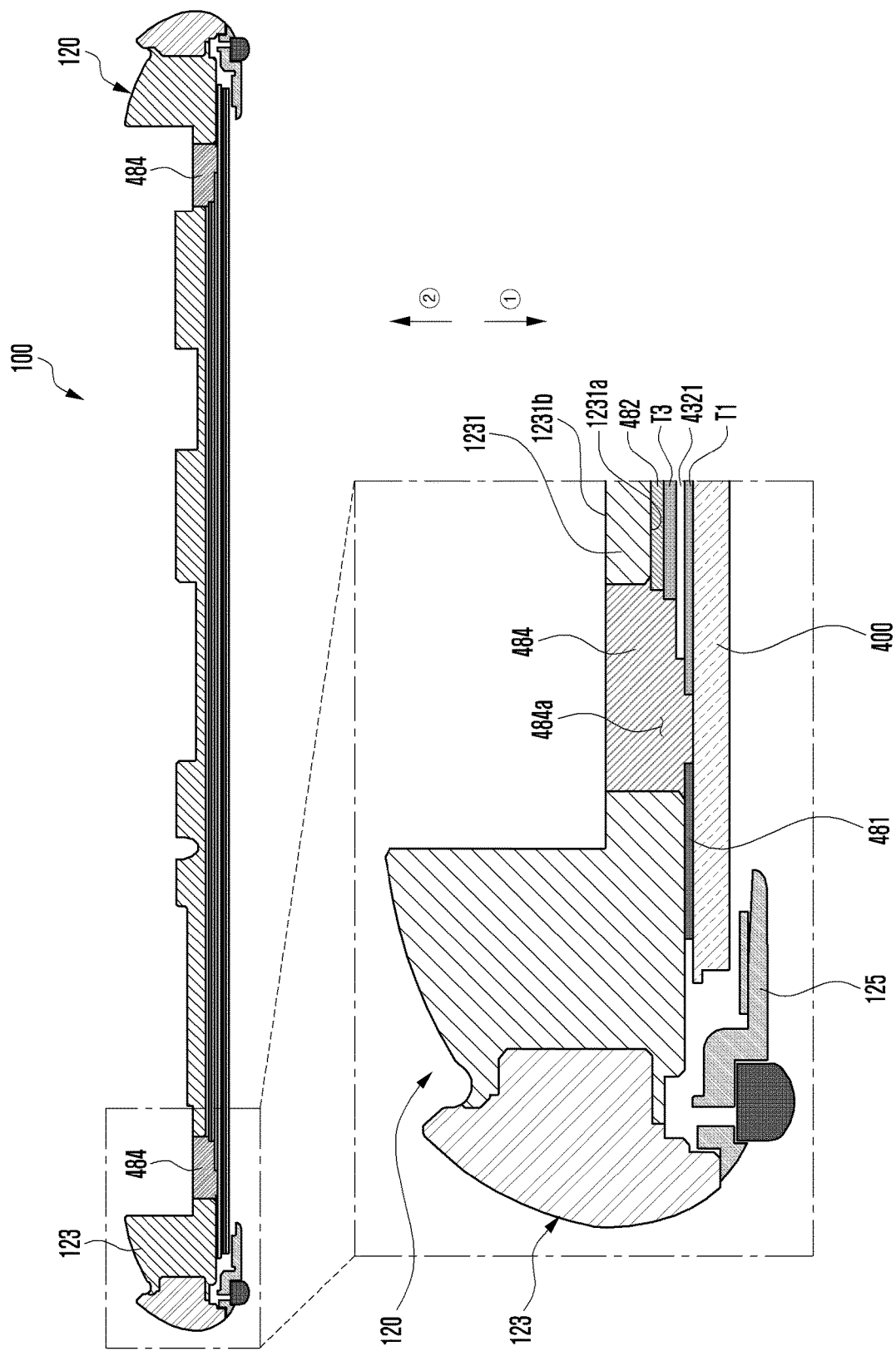
FIG. 6C is a cross-sectional view of a second housing viewed along line 6c-6c of FIG. 6A according to certain embodiments of the disclosure.

FIG. 6C is a cross-sectional view of the second housing viewed along line 6c-6c of FIG. 6A according to certain embodiments of the disclosure.

With reference to FIG. 6C, the second support member 1231 may include a third support surface 1231a facing a first direction (direction ①) and a fourth support surface 1231b facing a second direction (direction ②) opposite to the first direction (direction ①). According to an embodiment, the second support member 1231 may include a filling member injection hole 484a formed to penetrate from the fourth support surface 1231b to the third support surface 1231a. According to an embodiment, when the fourth support surface 1231b is viewed from above, the filling member injection hole 484a may be disposed at a position overlapping the discontinuous section cut off by the stepped portion between the first waterproof member 481 and the second waterproof member 482. According to an embodiment, a waterproofing filling member in a liquid or semi-solid form, as the third waterproof member 484, may be filled in the filling member injection hole 484a including the discontinuous section due to the stepped portion in a direction from the fourth support surface 1231b to the third support surface 1231a (direction ①), and then be solidified. In this case, the solidified third waterproof member 484 connects the first waterproof member 481 and the second waterproof member 482 and is fixed to the second support member 1231, which may help to form the sealed first waterproof space 4813.

According to certain embodiments, when the third waterproof member 484 is injected through the filling member injection hole 484a, the periphery of the flexible display 400 seen through the filling member injection hole 484a should be completely filled with the third waterproof member 484 to improve the waterproof function. Hence, the first adhesive member T1, the extension portion 4321, the third adhesive member T3, and the second waterproof member 482 of the flexible display 400 exposed through the filling member injection hole 484a may be arranged to have a positive step in a direction from the fourth support surface 1231b to the third support surface 1231a (direction ①). According to an embodiment, the first waterproof member 481 and the second support member 1231 may also be arranged to have a positive step in a direction of the third support surface 1231a (direction ①).

The waterproof structure according to certain embodiments of the disclosure has been applied to the foldable electronic device 100 including a flexible display 400, but it is not limited thereto. For example, it is also applicable to a bar type electronic device including a display and a slidable electronic device (e.g., rollable electronic device) in which the display area is varied by two housings slidably operable relative to one another.

According to certain embodiments, an electronic device (e.g., electronic device 100 in FIG. 3) may include: a first housing (e.g., second housing 120 in FIG. 3) including a first support member (e.g., second support member 1231 in FIG. 3); a second housing (e.g., first housing 110 in FIG. 3) foldably coupled to the first housing through a hinge mechanism (e.g., hinge mechanism 140 in FIG. 3) and including a second support member (e.g., first support member 1131 in FIG. 3); a flexible display (e.g., flexible display 400 in FIG. 3) disposed to be supported by the first housing and the second housing, the flexible display including: a window layer (e.g., window layer 410 in FIG. 4); a display panel (e.g., display panel 430 in FIG. 4) disposed under the window layer; and a bending portion (e.g., bending portion 432 in FIG. 4) extended from the display panel and attached to the rear surface of the display panel, the bending portion that includes an extension portion (e.g., extension portion 4321 in FIG. 4) extending outside the display panel and including a control circuit (e.g., control circuit 4321a in FIG. 4), and a flexible substrate (e.g., flexible substrate 4322 in FIG. 4) electrically connected to the extension portion; a first waterproof member (e.g., first waterproof member 481 in FIG. 5A) disposed between the display panel and the first support member to substantially surround the bending portion; a second waterproof member (e.g., second waterproof member 482 in FIG. 5A) disposed between the bending portion and the first support member; and a third waterproof member (e.g., third waterproof member 484 in FIG. 5A) that connects one end of the first waterproof member (e.g., one end 4811 in FIG. 5A) and one end of the second waterproof member, and connects the other end of the first waterproof member (e.g., other end 4812 in FIG. 5A) and the other end of the second waterproof member, such that when the flexible display is viewed from above, the control circuit and the flexible substrate may be arranged at positions overlapping a first waterproof space (e.g., first waterproof space 4813 in FIG. 5A) formed through the first waterproof member, the second waterproof member, and the third waterproof member.

According to certain embodiments, the flexible display may be disposed to be supported by the first support member and the second support member.

According to certain embodiments, the first support member may include a first support surface facing the flexible display, and a second support surface facing in a direction opposite to the first support surface; and the first, second and third waterproof members may be disposed between the display panel and the first support surface.

According to certain embodiments, the first support member may include a filling member injection hole formed from the first support surface to the second support surface, and the third waterproof member may be injected in a direction from the second support surface to the first support surface through the filling member injection hole.

According to certain embodiments, the third waterproof member may include a waterproofing filling member including a semi-solid or liquid material having a property of being solidified by natural or external conditions.

According to certain embodiments, the extension portion may be attached to the rear surface of the display panel through a first adhesive member, and the flexible substrate may be attached to the rear surface of the display panel through a second adhesive member.

According to certain embodiments, the control circuit may be sealed by a cover tape attached through a third adhesive member from at least some of the flexible substrate to at least some of the extension portion.

According to certain embodiments, the first adhesive member, the extension portion, the third adhesive member, and the second waterproof member exposed through the filling member injection hole may be arranged to have a positive step in a direction from the second support surface to the first support surface.

According to certain embodiments, the first waterproof member and/or the second waterproof member may include at least one of tape, adhesive, silicone, waterproof rubber, or urethane.

According to certain embodiments, the electronic device may further include a metal sheet layer disposed under the display panel, and the bending portion and the first, second and third waterproof members may be attached to the metal sheet layer.

According to certain embodiments, the flexible substrate may include a connector portion extended to a specified length, and the connector portion may be electrically connected to a substrate of the electronic device via a through hole formed in the first support member.

According to certain embodiments, the through hole may be formed at a position overlapping the first waterproof space when the flexible display is viewed from above.

According to certain embodiments, the electronic device may further include a fourth waterproof member having a closed loop shape that is disposed to form a second waterproof space between the display panel and the second support member.

According to certain embodiments, the electronic device may include at least one electronic component arranged at a position overlapping the second waterproof space through the second support member when the flexible display is viewed from above.

According to certain embodiments, the at least one electronic component may be configured to detect, generate or otherwise receiving information pertaining to an external environment through the flexible display.

According to certain embodiments, the at least one electronic component may include at least one camera module and/or at least one sensor module.

According to certain embodiments, the electronic device may include: at least one housing; a display disposed to be supported by the at least one housing, the display including: a window layer; a display panel disposed under the window layer; and a bending portion extended from the display panel and attached to the rear surface of the display panel, the bending portion that includes an extension portion extending outside the display panel and including a control circuit, and a flexible substrate electrically connected to the extension portion; a first waterproof member disposed between the display panel and the housing to substantially surround the bending portion; a second waterproof member disposed between the bending portion and the housing; and a third waterproof member that connects one end of the first waterproof member and one end of the second waterproof member, and connects the other end of the first waterproof member and the other end of the second waterproof member, such that when the flexible display is viewed from above, the control circuit and the flexible substrate may be arranged at positions overlapping a waterproof space formed through the first waterproof member, the second waterproof member, and the third waterproof member.

According to certain embodiments, the at least one housing may include a first housing including a first support member, and a second housing that is foldably coupled to the first housing through a hinge mechanism and includes a second support member; and the first, second and third waterproof members may be attached to the first support member.

According to certain embodiments, the third waterproof member may include a waterproofing filling member including a semi-solid or liquid material having a property of being solidified (e.g., as to be solidifiable) by natural or external conditions, and the waterproofing filling member may be injected in a direction from the first support member to the display through a filling member injection hole formed in the first support member.

According to certain embodiments, the flexible substrate may include a connector portion extended to a specified length, and the connector portion may be electrically connected to a substrate of the electronic device through a through hole formed at a position overlapping the waterproof space of the first support member when the flexible display is viewed from above.

In addition, the embodiments of the disclosure disclosed in the present specification and drawings are provided as specific examples to easily explain the technical details of the embodiments and help the understanding of the embodiments of the disclosure, and are not intended to limit the embodiments of the disclosure. Therefore, it should be understood that many variations and modifications of the basic inventive concept described herein will still fall within the embodiments of the disclosure.

The invention claimed is:

1. An electronic device, comprising:
a first housing including a first support member;
a second housing foldably coupled to the first housing through a hinge mechanism and including a second support member;
a flexible display supported by the first housing and the second housing, the flexible display including:
 a window layer,
 a display panel disposed under the window layer, and
 a bending portion extended from the display panel and attached to a rear surface of the display panel, the bending portion including:
  an extension portion extending outside the display panel and including a control circuit, and
  a flexible substrate electrically connected to the extension portion;
a first waterproof member disposed between the display panel and the first support member to substantially surround the bending portion;
a second waterproof member disposed between the bending portion and the first support member; and
a third waterproof member that connects one end of the first waterproof member and one end of the second waterproof member, and connecting another end of the first waterproof member and another end of the second waterproof member,
wherein when the flexible display is viewed from above, the control circuit and the flexible substrate overlap a first waterproof space formed through the first waterproof member, the second waterproof member, and the third waterproof member.

2. The electronic device of claim 1, wherein the flexible display is supported by the first support member and the second support member.

3. The electronic device of claim 1, wherein:
the first support member includes a first support surface facing the flexible display, and a second support surface facing in a direction opposite to the first support surface; and
the first, second and third waterproof members are disposed between the display panel and the first support surface.

4. The electronic device of claim 3, wherein:
the first support member includes a filling member injection hole formed as to penetrate from the first support surface to the second support surface; and
the third waterproof member is injected through the filling member injection hole in a direction from the second support surface to the first support surface.

5. The electronic device of claim 4, wherein the third waterproof member includes a waterproofing filling member including a semi-solid or liquid material solidifiable by natural or external conditions.

6. The electronic device of claim 4, wherein the extension portion is attached to a rear surface of the display panel through a first adhesive member, and the flexible substrate is attached to the rear surface of the display panel through a second adhesive member.

7. The electronic device of claim 6, wherein the control circuit is sealed by a cover tape attached through a third adhesive member and extending from at least some of the flexible substrate to at least some of the extension portion.

8. The electronic device of claim 7, wherein the first adhesive member, the extension portion, the third adhesive member, and the second waterproof member exposed through the filling member injection hole are arranged as to be stepped relative to one another, in a direction from the second support surface to the first support surface.

9. The electronic device of claim 1, wherein the first waterproof member and the second waterproof member include at least one of tape, adhesive, silicone, waterproof rubber, or urethane.

10. The electronic device of claim 1, further comprising a metal sheet layer disposed under the display panel, and wherein the bending portion and the first, second and third waterproof members are attached to the metal sheet layer.

11. The electronic device of claim 1, wherein:
the flexible substrate includes a connector portion extending by a first length; and
the connector portion is electrically connected to a substrate of the electronic device via a through hole formed in the first support member.

12. The electronic device of claim 11, wherein the through hole is formed at a position overlapping the first waterproof space, when the flexible display is viewed from above.

13. The electronic device of claim 1, further comprising a fourth waterproof member having a closed loop shape that is disposed to form a second waterproof space between the display panel and the second support member.

14. The electronic device of claim 13, comprising at least one electronic component arranged at a position overlapping the second waterproof space through the second support member, when the flexible display is viewed from above.

15. The electronic device of claim 14, wherein the at least one electronic component is configured to detect an external environment through the flexible display.

16. The electronic device of claim 15, wherein the at least one electronic component includes at least one camera module and at least one sensor module.

17. An electronic device comprising:
at least one housing;
a display supported by the at least one housing, the display including:
a window layer,
a display panel disposed under the window layer, and
a bending portion extending from the display panel and attached to a rear surface of the display panel, the bending portion including:
an extension portion extending outside the display panel and including a control circuit, and
a flexible substrate electrically connected to the extension portion,
a first waterproof member disposed between the display panel and the housing to substantially surround the bending portion,
a second waterproof member disposed between the bending portion and the housing, and
a third waterproof member that connects one end of the first waterproof member and one end of the second waterproof member, and connecting the other end of the first waterproof member and the other end of the second waterproof member,
wherein when the display is viewed from above, the control circuit and the flexible substrate are arranged at positions overlapping a waterproof space formed through the first waterproof member, the second waterproof member, and the third waterproof member.

18. The electronic device of claim 17, wherein:

the at least one housing comprises a first housing including a first support member, and a second housing that is foldably coupled to the first housing through a hinge mechanism and includes a second support member; and the first, second and third waterproof members are attached to the first support member.

19. The electronic device of claim 18, wherein:

the third waterproof member includes a waterproofing filling member including a semi-solid or liquid material solidifiable by natural or external conditions; and the waterproofing filling member is injected through a filling member injection hole formed in the first support member in a direction from the first support member to the display.

20. The electronic device of claim 18, wherein:

the flexible substrate includes a connector portion extending by a first length; and the connector portion is electrically connected to a substrate of the electronic device via a through hole formed at a position overlapping the waterproof space of the first support member, when the display is viewed from above.

* * * * *